(12) United States Patent
Song et al.

(10) Patent No.: US 11,314,592 B2
(45) Date of Patent: Apr. 26, 2022

(54) SEMICONDUCTOR MEMORY DEVICES AND METHODS OF OPERATING SEMICONDUCTOR MEMORY DEVICES

(71) Applicant: SAMSUNG ELECTRONICS CO., LTD., Suwon-si (KR)

(72) Inventors: Yeonggeol Song, Seoul (KR); Sungrae Kim, Seoul (KR); Kijun Lee, Seoul (KR)

(73) Assignee: SAMSUNG ELECTRONICS CO., LTD.

( * ) Notice: Subject to any disclaimer, the term of this patent is extended or adjusted under 35 U.S.C. 154(b) by 170 days.

(21) Appl. No.: 16/909,730

(22) Filed: Jun. 23, 2020

(65) Prior Publication Data

US 2021/0191809 A1    Jun. 24, 2021

(30) Foreign Application Priority Data

Dec. 23, 2019    (KR) .................. 10-2019-0173099

(51) Int. Cl.
*G06F 11/10* (2006.01)
*G11C 29/52* (2006.01)
(Continued)

(52) U.S. Cl.
CPC ...... *G06F 11/1068* (2013.01); *G11C 11/4091* (2013.01); *G11C 11/4093* (2013.01);
(Continued)

(58) Field of Classification Search
CPC ............. G06F 11/1068; G11C 11/4091; G11C 11/4093; G11C 11/565; G11C 29/52; H01L 25/0657; H01L 2225/06541
See application file for complete search history.

(56) References Cited

U.S. PATENT DOCUMENTS 6,691,277 B1    2/2004  Golnabi et al.
8,327,242 B1 *  12/2012 Anholt .............. H03M 13/1525
                                                    714/785

(Continued)

FOREIGN PATENT DOCUMENTS

JP    2001-86006 A    3/2001
KR    10-0510503 B1   6/2005

OTHER PUBLICATIONS

Liu et al., "Low-Power High-Throughput BCH Error Correction VLSI Design for Multi-Level Cell NAND Flash Memories", 2006 IEEE Workshop on Signal Processing Systems Design and Implementation, Banff, Alta., CA, Oct. 2-4, 2006, pp. 303-308.

*Primary Examiner* — Kyle Vallecillo
(74) *Attorney, Agent, or Firm* — Myers Bigel, P.A.

(57) ABSTRACT

A semiconductor memory device includes a memory cell array, an error correction circuit and a control logic circuit. The error correction circuit includes an error correction code (ECC) decoder to perform an ECC decoding on a codeword including a main data and a parity data, read from a target page of the memory cell array to correct errors in the read codeword. The control logic circuit controls the error correction circuit based on a command and address from an external memory controller. The ECC decoder has t-bit error correction capability, generates a syndrome based on the codeword using a parity check matrix, performs t iterations during (t−2) cycles to generate an error locator polynomial based on the syndrome, searches error positions in the codeword based on the error locator polynomial and corrects the errors in the codeword based on the searched error positions.

20 Claims, 21 Drawing Sheets

(51) Int. Cl.
*G11C 11/4091* (2006.01)
*G11C 11/56* (2006.01)
*G11C 11/4093* (2006.01)
*H01L 25/065* (2006.01)

(52) U.S. Cl.
CPC ............ *G11C 11/565* (2013.01); *G11C 29/52* (2013.01); *H01L 25/0657* (2013.01); *H01L 2225/06541* (2013.01)

(56) References Cited

U.S. PATENT DOCUMENTS

| | | | |
|---|---|---|---|
| 8,949,697 B1* | 2/2015 | Chang | H03M 13/1545 |
| | | | 714/781 |
| 9,459,836 B2 | 10/2016 | Hung et al. | |
| 10,097,208 B2 | 10/2018 | Ilani et al. | |
| 10,243,588 B2 | 3/2019 | Kim | |
| 2010/0257433 A1* | 10/2010 | Weingarten | H03M 13/1565 |
| | | | 714/782 |
| 2010/0332955 A1* | 12/2010 | Anholt | G06F 11/1008 |
| | | | 714/781 |
| 2012/0290901 A1* | 11/2012 | Kong | H03M 13/3715 |
| | | | 714/781 |
| 2014/0026010 A1* | 1/2014 | Anholt | H03M 13/152 |
| | | | 714/758 |
| 2014/0059403 A1* | 2/2014 | Sommer | H03M 13/6337 |
| | | | 714/758 |
| 2014/0059405 A1* | 2/2014 | Syu | G06F 11/1072 |
| | | | 714/773 |
| 2018/0034481 A1 | 2/2018 | Garani et al. | |
| 2018/0217894 A1* | 8/2018 | Park | G11C 11/5628 |
| 2020/0210292 A1* | 7/2020 | Kim | H03M 13/152 |

* cited by examiner

FIG. 6
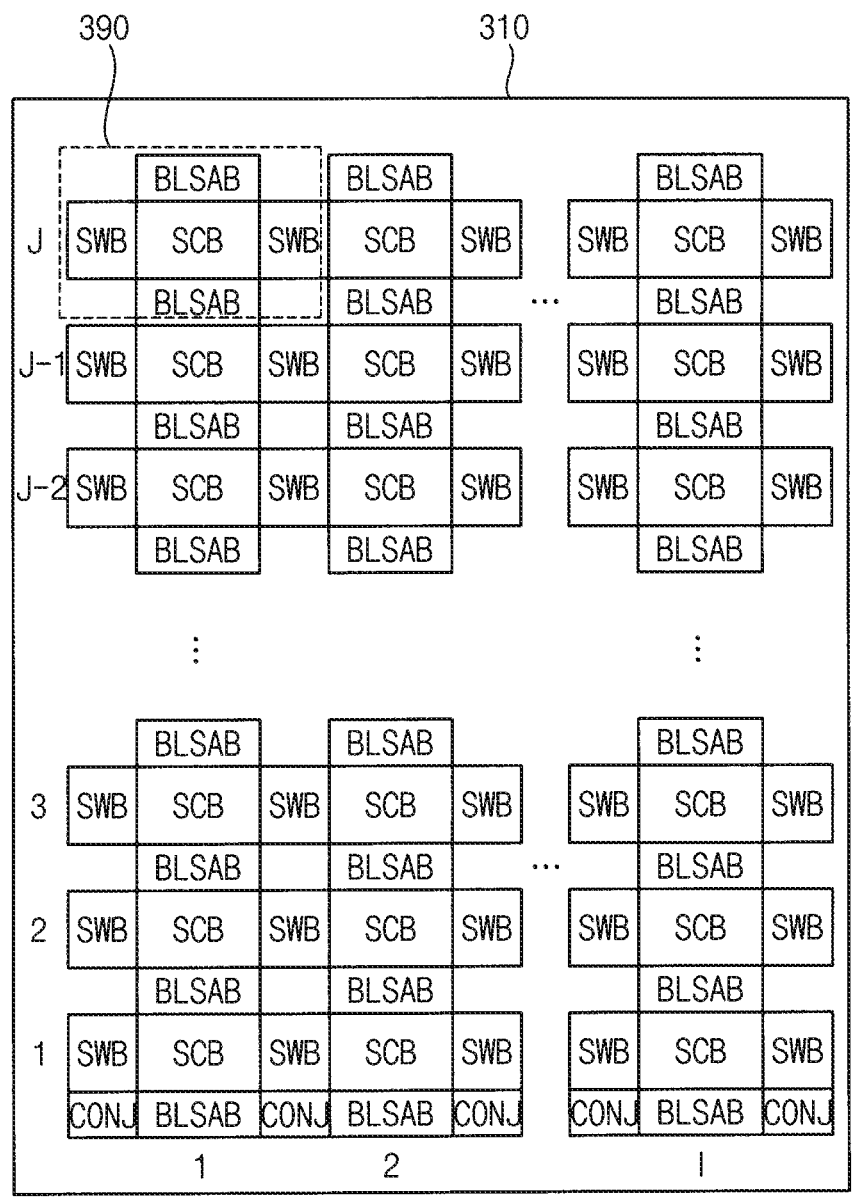
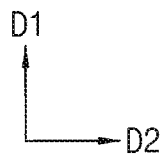

FIG. 13

```
Initialization : k(0) = 0, γ(0) = 1  Θ[3t/2]+1(0) = 1
δi(0) = 0 (t+1≤i≤{3t/2}+1), Θi(0) = 0
(t-1≤i≤{3t/2})
Input: Si (i = 1, 2, ⋯, 2t-1)
δi(0) = S2t (0≤i≤t-1), Θi(0) = S2t+1 (0≤i≤t-2)
for r = 0 step until t-1 do begin
Step 1: δi(r+1) = γ(r)* δi+1(r) - δ0(r)* Θi+1(r),
(0≤i≤{3t/2})
Step 2: if δ0(r) ≠ 0 and k(r) ≥0 then begin
  Θi(r+1) - δi+1(r) (0≤i≤{3t/2}+1, i ≠ t-2-r )
  γ(r+1) = δ0(r)
k(r+1) = -k(r)
end
else begin
Θi(r+1) = Θi(r), (0≤i≤{3t/2}+1, i ≠ t-2-r )
γ(r+1) = γ(r)
k(r+1) = k(r) +2
end
  Θi(r+1) = 0, (i = t-2-r)
endfor
  Output: λ2i(t) = δi(t), (i= 0, 1, ⋯, [t/2])
λ2i+1(t) = δt+i(t), (i= 0, 1, ⋯, [t/2]-2)
```

FIG. 15B
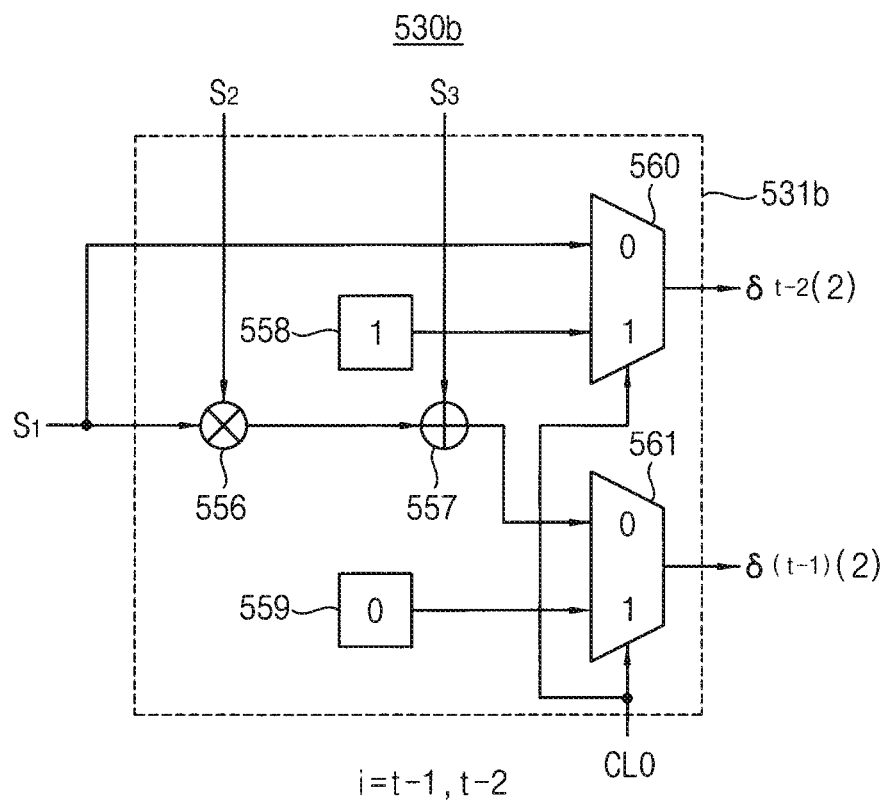
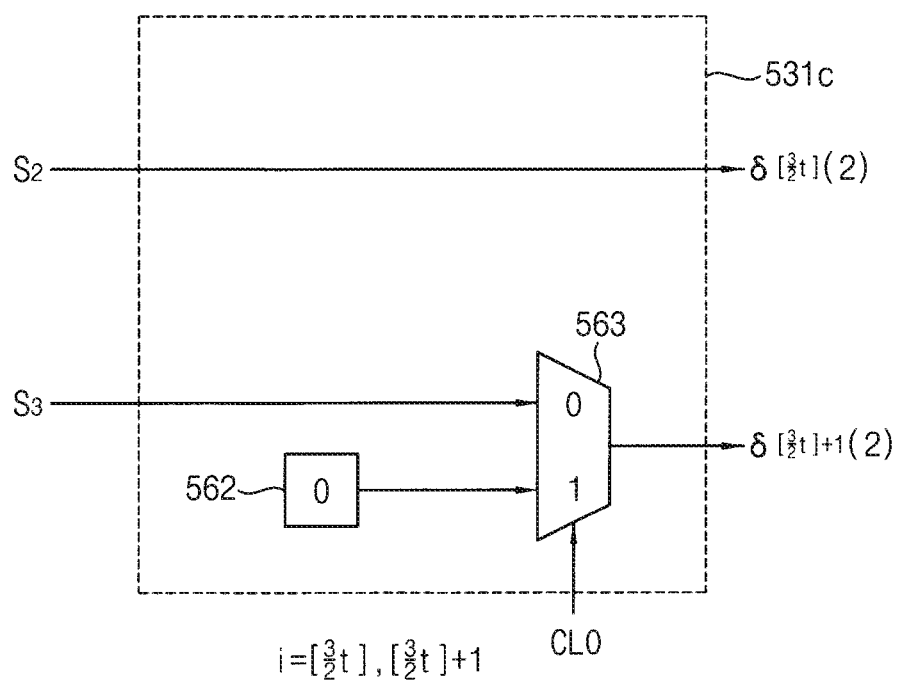

SEMICONDUCTOR MEMORY DEVICES AND METHODS OF OPERATING SEMICONDUCTOR MEMORY DEVICES

CROSS-REFERENCE TO RELATED APPLICATIONS

This US application claims the benefit of priority under 35 USC § 119 to Korean Patent Application No. 10-2019-0173099, filed on Dec. 23, 2019, in the Korean Intellectual Property Office, the disclosure of which is incorporated by reference in its entirety herein.

BACKGROUND

The present disclosure relates to memories, and more particularly to semiconductor memory devices and methods of operating semiconductor memory devices.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, bit errors of memory cells in the DRAMs may rapidly increase and the yield of the DRAMs may decrease. Therefore, there is a need for credibility of the semiconductor memory device by reducing bit errors of memory cells in DRAMs.

SUMMARY

Example embodiments may provide a semiconductor memory device with enhanced performance.

Example embodiments may provide a method of operating a semiconductor memory device with enhanced performance.

According to example embodiments, a semiconductor memory device includes a memory cell array, an error correction circuit, and a control logic circuit. The memory cell array includes a plurality of memory cells coupled to word-lines and bit-lines, and further includes a plurality of sense amplifiers to sense data stored in the plurality of memory cells. The error correction circuit includes an error correction code (ECC) decoder to perform an ECC decoding on a codeword read from a target page of the memory cell array to correct errors in the read codeword. The codeword includes a main data and a parity data. The control logic circuit controls the error correction circuit based on a command and address from an external memory controller. The ECC decoder is configured to perform t-bit error correction (t is an even integer greater than three), generate a syndrome based on the codeword using a parity check matrix, perform t iterations during (t−2) cycles to generate an error locator polynomial based on the syndrome, search error positions in the codeword based on the error locator polynomial, and correct the errors in the codeword based on the error positions that were searched.

According to example embodiments, there is provided a method of operating a semiconductor memory device which includes a memory cell array that includes a plurality of memory cells coupled to word-lines and bit-lines, and an error correction circuit. According to the method, a codeword including a main data and a parity data is read from the target page of the memory cell array, and errors in the codeword are corrected by an error correction code (ECC) decoder of the error correction circuit by performing an ECC decoding on the codeword. The ECC decoder is configured to perform t-bit error correction (t is an even integer greater than three), generate a syndrome based on the codeword using a parity check matrix, perform t iterations during (t−2) cycles to generate an error locator polynomial based on the syndrome, search error positions in the codeword based on the error locator polynomial and correct the errors in the codeword based on the error positions that were searched.

According to example embodiments, a semiconductor memory device includes a memory cell array, an error correction circuit, and a control logic circuit. The memory cell array includes a plurality of memory cells coupled to word-lines and bit-lines, and a plurality of sense amplifiers to sense data stored in the plurality of memory cells. The error correction circuit includes an error correction code (ECC) decoder to perform an ECC decoding on a read from a target page of the memory cell array to correct errors in the read codeword. The codeword include a main data and a parity data. The control logic circuit controls the error correction circuit based on a command and address from an external memory controller. The ECC decoder is configured to perform t-bit error correction (t being an even integer greater than three), generate a syndrome based on the codeword using a parity check matrix, perform t iterations during (t−2) cycles to generate an error locator polynomial based on the syndrome, search error positions in the codeword based on the error locator polynomial and correct the errors in the codeword based on the error positions that were searched. The ECC decoder includes a Berlekamp-Massey generator to generate coefficients of the error locator polynomial during the (t−2) cycles based on the syndrome.

Accordingly, an ECC decoder may perform t iterations during (t−2) cycles to generate an error locator polynomial based on syndrome, may search error positions in the codeword based on the error locator polynomial and may correct the errors based on the searched error positions when performing an ECC decoding. Therefore, the ECC decoder may reduce latency.

BRIEF DESCRIPTION OF THE DRAWINGS

Example embodiments will be described below in more detail with reference to the accompanying drawings.

FIG. 6 illustrates an example of the first bank array in the semiconductor memory device of FIG. 2 according to example embodiments.

FIG. 13 illustrates a simplified inversionless BM (SiBM) algorithm which the BM calculator of FIG. 10 executes.

FIGS. 15A and 15B are block diagrams illustrating the second intermediate coefficient calculator or generator in FIG. 12 according to example embodiments.

DETAILED DESCRIPTION

Various example embodiments will be described more fully hereinafter with reference to the accompanying drawings, in which example embodiments are shown.

Figure 1:
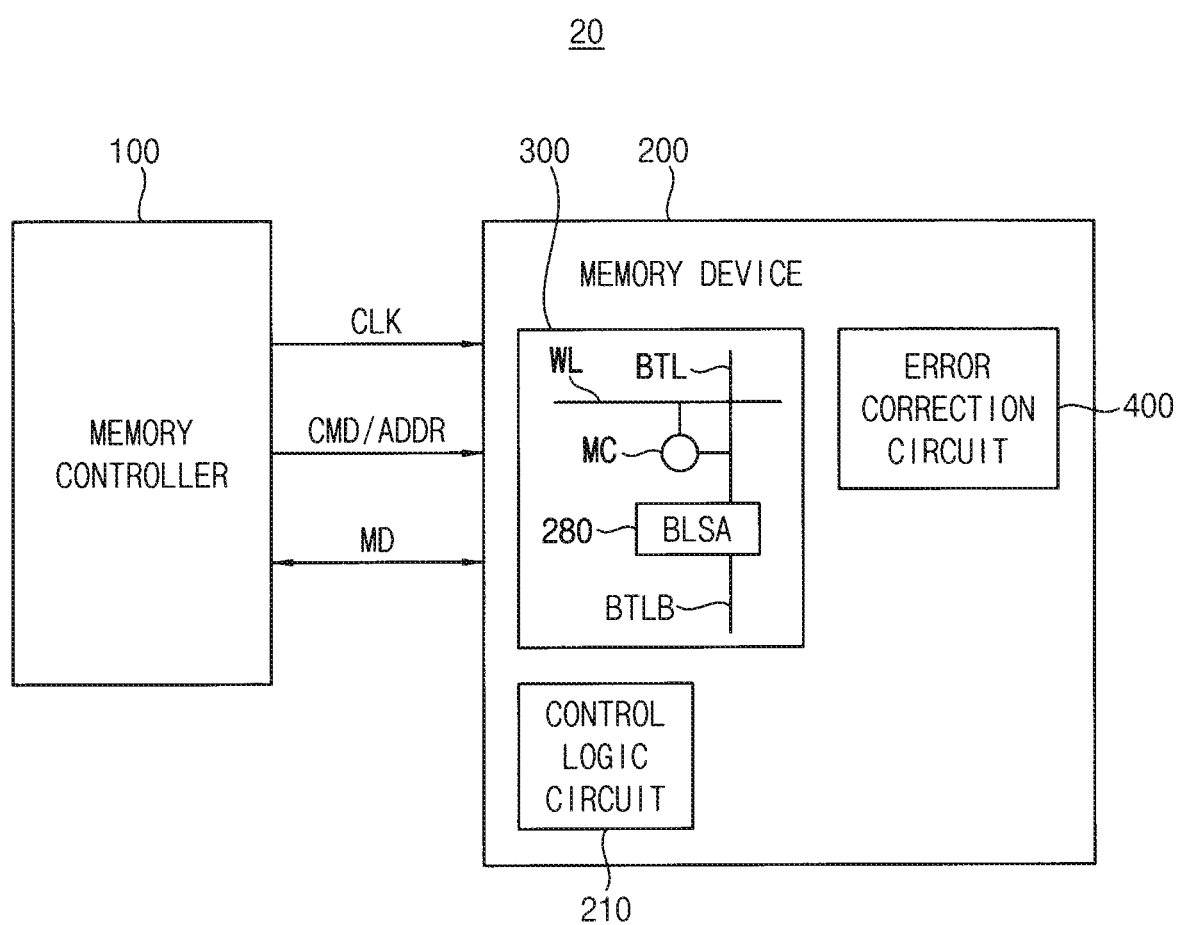
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200.

For example, the memory controller 100 may write data in the semiconductor memory device 200 or read data from the semiconductor memory device 200 in response to a request from the host. In addition, the memory controller 100 may issue operation commands to the semiconductor memory device 200 for controlling the semiconductor memory device 200. The memory controller 100 transmits a clock signal CLK, a command CMD (signal) and an address (signal) ADDR to the semiconductor memory device 200 and exchanges main data MD with the semiconductor memory device 200.

In some embodiments, the semiconductor memory device 200 is a memory device including dynamic memory cells such as a dynamic random access memory (DRAM), double data rate 4 (DDR4) synchronous DRAM (SDRAM), a DDR5 SDRAM a low power DDR4 (LPDDR4) SDRAM or a LPDDR5 SDRAM.

The semiconductor memory device 200 includes a memory cell array 300 that stores the main data MD and parity data, an error correction circuit 400 and a control logic circuit 210. The parity data may be transferred from the memory controller 100 along with the main data MD.

The memory cell array 300 may include a plurality of memory cells MCs coupled to each word-line WL and each bit-line BL and a sense amplifier BLSA 280 coupled to the bit-line BL and a complementary bit-line BLB.

The control logic circuit 210 controls the error correction circuit 400 such that the error correction circuit 400 may perform an ECC encoding on data to be stored in a target page of the memory cell array 300 and may perform an ECC decoding on data read from the target page. The error correction circuit 400 may have t-bit error correction capability, (t being an even integer greater than three), may perform t iterations during (t−2) cycles and generate a coefficient of an error locator polynomial.

The control logic circuit 210 may control access on the memory cell array 300 and may control the error correction circuit 400 based on the command CMD and the address ADDR from the memory controller 100.

Figure 2:
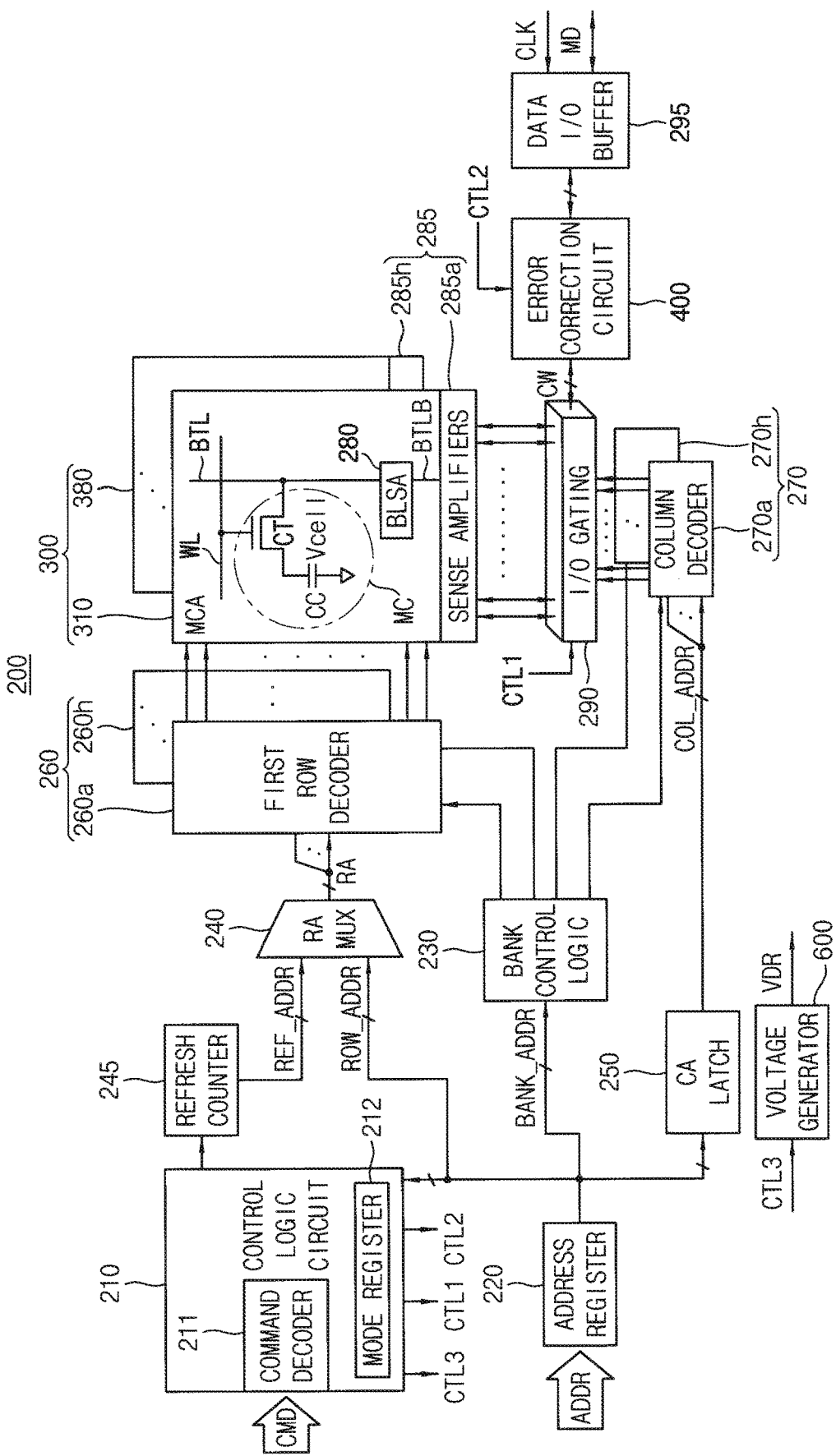
FIG. 2 is a block diagram illustrating an example of the semiconductor memory device in FIG. 1 according to example embodiments.

FIG. 2 is a block diagram illustrating an example of the semiconductor memory device in FIG. 1 according to example embodiments.

Referring to FIG. 2, the semiconductor memory device 200 includes a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, an error correction circuit 400 and a voltage generator 600.

The memory cell array 300 includes first through eighth bank arrays 310~380. The row decoder 260 includes first through eighth bank row decoders 260a~260h respectively coupled to the first through eighth bank arrays 310~380. The column decoder 270 includes first through eighth bank column decoders 270a~270h respectively coupled to the first through eighth bank arrays 310~380. The sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h, and first through eighth bank sense amplifiers 285a~285h may form first through eighth banks. Each of the first through eighth bank arrays 310~380 includes a plurality of memory cells MC coupled to word-lines WL and bit-lines BTL The plurality of memory cells MC may correspond to volatile memory cells having DRAM cell structure.

Each of the first through eighth bank arrays 310~380 may include a plurality of memory cells MCs coupled to each word-line WL and each bit-line BL and a bit-line sense amplifier BLSA 280 coupled to the bit-line BL and a complementary bit-line BLB. Each of the memory cells MCs includes a cell transistor CT and a cell capacitor CC. A gate of the cell transistor CT is connected to one of the word-lines WLs arranged in a row direction of the memory cell array 300. One end of the cell transistor CT is connected to one of the bit-lines BLs arranged in a column direction of the memory cell array 300. The other end of the cell transistor CT is connected to the cell capacitor CC. The cell capacitor CC may store charges of various capacities corresponding to multi-bit data, for example, 2-bit data or may store a single bit data. The cell capacitor CC may be restored with an amount of charge that corresponds to a capacity of each of the multi-bit data items, that is, the cell capacitor CC may be restored to the cell voltage Vcell.

Although the semiconductor memory device 200 is illustrated in FIG. 2 as including eight banks of various components, example embodiments of the present disclosure are not limited thereto, and the semiconductor memory device 200 may include any number of banks of various components.

The address register 220 receives an address ADDR including a bank address BANK_ADDR, a row address ROW_ADDR and/or a column address COL_ADDR, and a command CMD from the memory controller 100.

The address register 220 may provide the received bank address BANK_ADDR to the bank control logic 230, the received row address ROW_ADDR to the row address multiplexer 240, and the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output one of the row address ROW_ADDR the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In example embodiments, in a burst mode, the column address latch 250 may generate column addresses that increment from the received column address COL_ADDR. The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the input/output gating circuit 290 to output data corresponding to the bank address BANK_ADDR and the column address COL_ADDR.

The I/O gating circuit 290 includes circuitry for gating input/output data. The I/O gating circuit 290 further includes read data latches for storing data that is output from the first through eighth bank arrays 310~380, and write drivers for writing data to the first through eighth bank arrays 310~380.

Codeword CW to be read from one bank array of the first through eighth bank arrays 310~380 may be sensed by a sense amplifier coupled to the one bank array from which the codeword is to be read, and may be stored in the read data latches. The codeword CW stored in the read data latches is ECC-decoded by the error correction circuit 400 and may be provided to the memory controller 100 via the data I/O buffer 295.

Data (or the main data) MD to be written in one bank array of the first through eighth bank arrays 310~380 may be provided to the data I/O buffer 295 from the memory controller 100. The main data MD is provided to the error correction circuit 400.

The error correction circuit 400 performs ECC encoding on the main data MD to generate a parity data, and provides the I/O gating circuit 290 with the codeword CW including the main data MD and the parity data. The I/O gating circuit 290 may store the main data MD and the parity data target page of the memory cell array 300 after ECC encoding has been performed, based on a second control signal CTL2. In addition, the error correction circuit 400 may correct t-bit errors in the read data by performing an ECC decoding on the codeword CW read from the memory cell array 300 based on the parity data.

The control logic circuit 210 may control operations of the semiconductor memory device 200. For example, the control logic circuit 210 may generate control signals for the semiconductor memory device 200 to perform a write operation or a read operation. The control logic circuit 210 may include a command decoder 211 that decodes the command CMD received from the memory controller 100, and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, and a second control signal CTL2 to control the error correction circuit 400. In addition, the control logic circuit 210 may control the voltage generator 600 to adjust a driving voltage VDR applied to the bit-line sense amplifier 280 through a third control signal CTL3.

The data I/O buffer 295 may receive the clock signal CLK and the main data MD from the memory controller 100 and may provide the main data MD to the error correction circuit 400.

Figure 3:
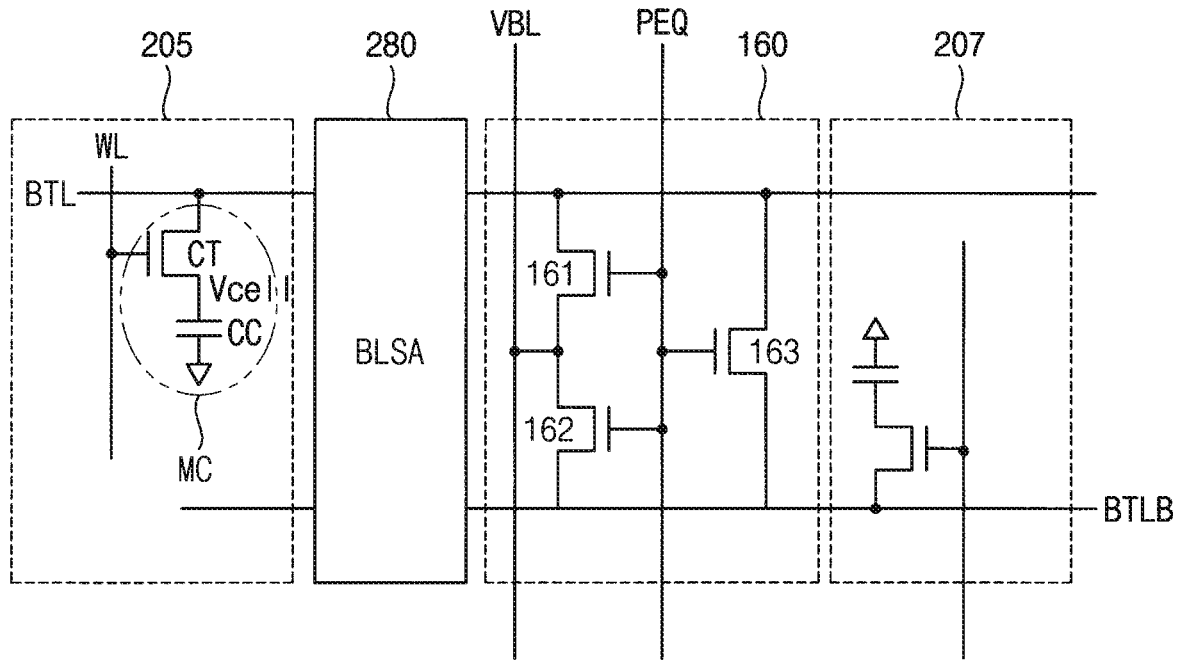
FIG. 3 illustrates the memory cell and the sense amplifier in the semiconductor memory device in FIG. 2.

FIG. 3 illustrates the memory cell and the sense amplifier in the semiconductor memory device in FIG. 2.

Referring to FIG. 3, the sense amplifier 280 may be connected to the memory cell MC and an equalizing circuit 160 through a pair of bit-lines BTL and BTLB, which is the complementary bit-line of bit-line BTL. The equalizing circuit 160 includes first through third transistors 161, 162 and 163. The first through third transistors 161, 162 and 163 equalize the pair of bit-lines BTL and BTLB with a pre-charge voltage VBL in response to an equalizing signal PEQ. The equalizing signal PEQ may be provided by the control logic circuit 210 in accordance with a pre-charge command. The pre-charge voltage VBL may be set to have a level corresponding to a half of a level of a power voltage driving the sense amplifier 280.

The sense amplifier 280 may be configured in an open bit-line structure and is connected to the memory cell MC. In the open bit-line structure, the pair of bit-lines BTL and BTLB are separately positioned in different adjacent main cell blocks 205 and 207. In the open bit-line structure, when the word-line WL of the selected memory cell MC is enabled, the data of the memory cell MC may be read or written through the selected bit-line BTL. At this time, while the data of the memory cell MC is accessed via the selected bit-line BTL, since the selected memory cell is not on the complementary bit-line BTLB, the level of the pre-charge voltage VBL is maintained as a reference voltage level. Therefore, the sense amplifier 280 may sense the cell voltage Vcell of the memory cell MC by using charges shared through the bit-line BTL.

The sense amplifier 280 may be configured to sense the cell voltage Vcell stored in the memory cell MC as a first bit corresponding to a most significant bit (MSB) and a second bit corresponding to a least significant bit (LSB) of the 2-bit data and, after sensing, may be configured to restore the cell voltage Vcell corresponding to the sensed MSB and LSB in the memory cell MC. For example, the sense amplifier 280 may perform first to third charge sharing operations by using a cell capacitance of the memory cell MC, a bit-line capacitance of each of the pair of bit-lines BTL and BTLB, a bit-line capacitance of each of a pair of holding bit-lines HBL and HBLB (FIG. 5), a bit-line capacitance of each of the pair of first sensing bit-lines SBL1 and SBLB1 (FIG. 5), and a bit-line capacitance of each of a pair of second sensing bit-lines SBL2 and SBLB2 (FIG. 5) and changes in the bit-line capacitances. The sense amplifier 280 senses the MSB and LSB of the 2-bit data by performing the first to third charge sharing operations, and may restore the cell voltage Vcell corresponding to the sensed MSB and LSB in the memory cell MC.

The sense amplifier 280 may combine the sensed MSB and LSB by performing the third charge sharing operation. The sense amplifier 280 may restore the cell voltage Vcell generated in accordance with the combination of the sensed MSB and LSB in the memory cell MC.

Figure 4:
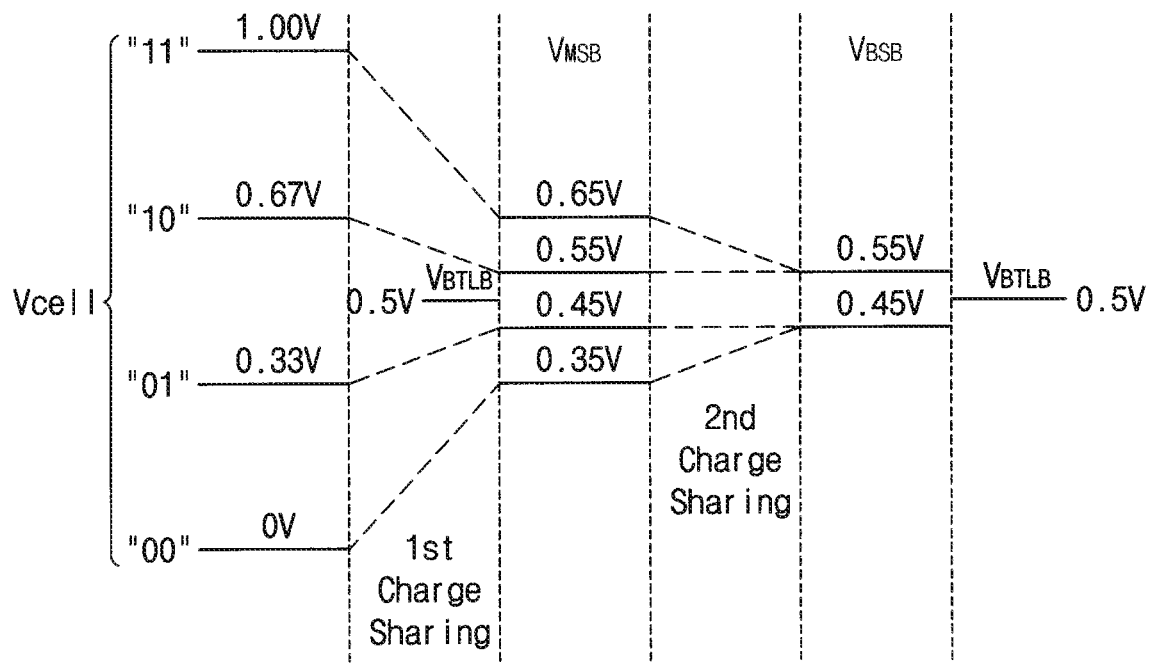
FIG. 4 illustrates multi-bit data of a memory cell sensed by the sense amplifier in FIG. 3.

FIG. 4 illustrates multi-bit data of a memory cell sensed by the sense amplifier in FIG. 3.

Referring to FIG. 4, the cell voltage Vcell of the memory cell MC represents the MSB and the LSB of the 2-bit data. Different cell voltage Vcell stored in the memory cell MC may represent a different respective one of the bit combinations "00", "01", "10", or "11". For example, when the power voltage VINTA is 1.0 V, it may be set so that a voltage difference of about 330 mV to 340 mV is provided between bit combinations. That is, the cell voltage Vcell of 0 V may represent the bit combination "00", the cell voltage Vcell of 0.33 V may represent the bit combination "01", the cell voltage Vcell of 0.67 V may represent the bit combination "10", and the cell voltage Vcell of 1.0 V may represent the bit combination "11".

In example embodiments, levels of the cell voltage Vcell representing each of the bit combinations "00", "01", "10", or "11" may be varied.

In the sense amplifier 280 for sensing the MSB of the memory cell MC, when the first charge sharing operation is performed including charge sharing between the charges stored in the cell capacitor CC and the charges stored in the bit-line BTL and in the holding bit-line HBL, the bit-line BL and the holding bit-line HBL are captured to have a pre-scribed MSB voltage $V_{MSB}$. The bit-line BTL may be transited from the pre-charge voltage VBL level, that is, 0.5 V to the MSB voltage $V_{MSB}$. At this time, the complementary bit-line BLB may maintain the level of the pre-charge voltage VBL.

For example, a voltage level of the bit-line BTL may be captured as the MSB voltage $V_{MSB}$ of about 0.35 V by the first charge sharing operation for the cell voltage Vcell of 0 V of the bit combination "00". The voltage level of the bit-line BL may be captured as the MSB voltage $V_{MSB}$ of about 0.45 V by the first charge sharing operation for the cell voltage Vcell of 0.33 V of the bit combination "01". The voltage level of the bit-line BL may be captured as the MSB voltage $V_{MSB}$ of about 0.55 V by the first charge sharing operation for the cell voltage Vcell of 0.67 V of the bit combination "10". The voltage level of the bit-line BTL may be captured as the MSB voltage $V_{MSB}$ of about 0.65 V by the first charge sharing operation for the cell voltage Vcell of 1.0 V of the bit combination "11".

The voltage level of the bit-line BTL of each of the bit combinations "00", "01", "10", and "11" in accordance with the first charge sharing operation thus may be captured as the MSB voltage $V_{MSB}$ of about 0.35 V, 0.45 V, 0.55 V, or 0.65 V, respectively. At this time, the complementary bit-line BTLB maintains the pre-charge voltage VPRE of 0.5 V. A prescribed voltage difference, that is, −150 mV, −50 mV, 50 mV, or 150 mV, may lie between the MSB voltage $V_{MSB}$ of the bit-line BTL and a complementary bit-line voltage $V_{BLB}$ of 0.5 V, with the different prescribed voltage differences corresponding respectively to the bit combinations "00", "01", "10", and "11".

In the sense amplifier 280 for sensing the LSB of the memory cell MC, when the second charge sharing operation is performed including charge sharing generated between the charges stored in the bit-line BTL and the holding bit-line HBL and the charges stored in the first sensing bit-line SBL1, and also charge sharing generated between the charges stored in the complementary bit-line BTLB and the complementary holding bit-line HBLB and the charges stored in the first complementary sensing bit-line SBLB1, the bit-line BL is captured as a prescribed LSB voltage $V_{LSB}$. The bit-line BL may be transitioned from the MSB voltage $V_{MSB}$ to the LSB voltage $V_{LSB}$.

For example, for the bit combination "00", the voltage level of the bit-line BTL having the MSB voltage $V_{MSB}$ of about 0.35 V may be captured as the LSB voltage $V_{LSB}$ of about 0.45 V in the second charge sharing operation. At this time, the voltage level of the complementary bit-line BTLB may be captured as the complementary bit-line voltage $V_{BLB}$ of about 0.5 V. For the bit combination "01", the voltage level of the bit-line BTL having the MSB voltage $V_{MSB}$ of about 0.45 V mat be captured as the LSB voltage $V_{LSB}$ of about 0.45 V in the second charge sharing operation, and the complementary bit-line voltage $V_{BTLB}$ may be captured as 0.5 V. For the bit combination "10", the voltage level of the bit-line BL having the MSB voltage $V_{MSB}$ of 0.55 V may be captured as the LSB voltage $V_{LSB}$ of about 0.55 V in the second charge sharing operation, and the complementary bit-line voltage $V_{BTLB}$ may be captured as 0.5 V. For the bit combination "11", the voltage level of the bit-line BTL having the MSB voltage $V_{MSB}$ of 0.65 V may be captured as the LSB voltage $V_{LSB}$ of about 0.55 V in the second charge sharing operation, and the complementary bit-line voltage $V_{BTLB}$ may be captured as 0.5 V.

The voltage level of the bit-line BTL of each of the bit combinations "00" and "01" in accordance with the second charge sharing operation is captured as the LSB voltage $V_{LSB}$ of about 0.45 V and 0.45 V, respectively, and the level of the complementary bit-line voltage $V_{BTLB}$ is captured as about 0.5 V. The voltage level of the bit-line BTL of each of the bit combinations "10" and "11" is captured as the LSB voltage $V_{LSB}$ of about 0.55 V and 0.55 V, respectively, and the level of the complementary bit-line voltage $V_{BTLB}$ is captured as about 0.55 V. A prescribed voltage difference, corresponding to each of the bit combinations "00", "01", "10", and "11", that is, −50 mV, 50 mV, −50 mV, or 50 mV, lies between the LSB voltage $V_{LSB}$ of the bit-line BTL and the complementary bit-line voltage $V_{BTLB}$, which means that the LSB voltage $V_{LSB}$ corresponding to each of the bit combinations "00", "01", "10", and "11" operates as a self-reference that does not require an additional reference voltage for sensing the LSB voltage $V_{LSB}$.

Figure 5:
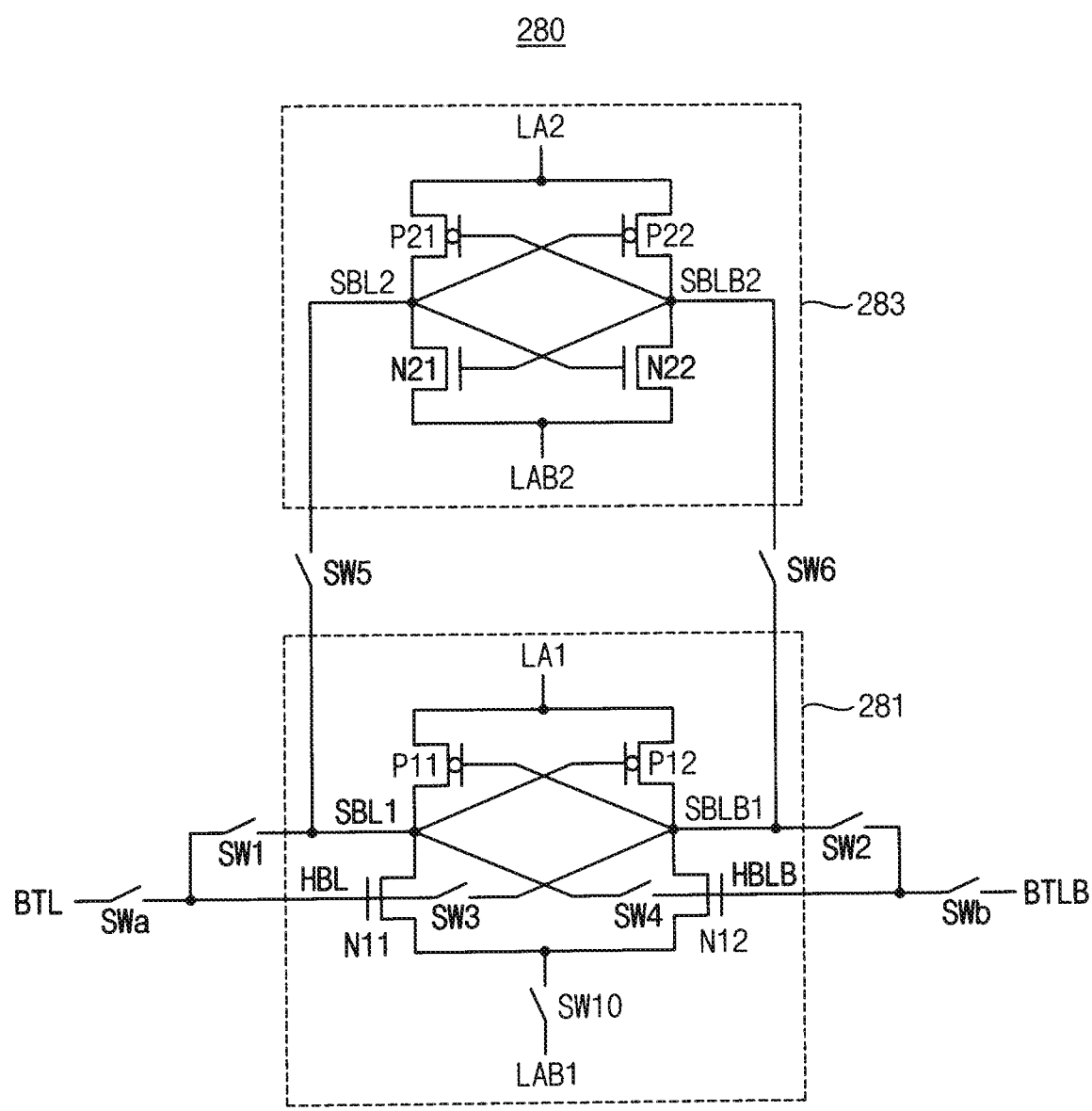
FIG. 5 is a circuit diagram illustrating an example of the sense amplifier in FIG. 3 according to according to example embodiments.

FIG. 5 is a circuit diagram illustrating an example of the sense amplifier in FIG. 3 according to according to example embodiments.

Referring to FIG. 5, the sense amplifier 280 may include a sense amplifying circuit 281, a latch circuit 283 and a switching circuit including a bit-line switch SWa, a complementary bit-line switch SWb, a power switch SW10, and first to sixth switches SW1 to SW6.

The sense amplifying circuit 281 is connected to a first sensing signal LA1 and a second sensing signal LAB1 and includes p-channel metal-oxide-semiconductor (PMOS) transistors P11 and P12 and n-channel metal-oxide-semiconductor (NMOS) transistors N11 and N12. A first power supply voltage VINTA1, a ground voltage VSS, and the pre-charge voltage VBL may be applied to each of the first and second sensing signals LA1 and LAB1 in accordance with control of the control logic circuit 210 for controlling an operation of the sense amplifier 280. The first power supply voltage VINTA1, the ground voltage VSS and the pre-charge voltage VBL may be included in a first driving voltage set. The sense amplifying circuit 280 may sequentially read the first bit and the second bit of the multi-bit data stored in the memory cell MC.

One end of the PMOS transistor P11 is connected to a line of the first sensing signal LA1, the other end of the PMOS transistor P11 is connected to a first sensing bit-line SBL1, and a gate of the first PMOS transistor P11 is connected to a first complementary sensing bit-line SBLB1. One end of the PMOS transistor P12 is connected to the line of the first sensing signal LA1, the other end of the second PMOS transistor P12 is connected to the first complementary sensing bit-line SBLB1, and a gate of the PMOS transistor P12 is connected to the first sensing bit-line SBL1. One end of the NMOS transistor N11 is connected to the power switch SW10, the other end of the NMOS transistor N11 is connected to the first sensing bit-line SBL1, and a gate of the first NMOS transistor N11 is connected to a holding bit-line HBL. One end of the second NMOS transistor N12 is connected to the power switch SW10, the other end of the NMOS transistor N12 is connected to the first complementary sensing bit-line SBLB1, and a gate of the NMOS transistor N12 is connected to the complementary holding bit-line HBLB.

The bit-line switch SWa is connected between the bit-line BTL and the holding bit-line HBL and is turned on or off in response to the control of the control logic circuit 210. The complementary bit-line switch SWb is connected between the complementary bit-line BTLB and the complementary holding bit-line HBLB and is turned on or off in response to the control of the control logic circuit 210. The power switch SW10 is connected between one end of each of the NMOS transistors N11 and N12 and a line of the second sensing signal LAB1 and is turned on or off in response to the control of the control logic circuit 210.

The first switch SW1 is connected between the holding bit-line HBL and the first sensing bit-line SBL1 and is turned on or off in response to the control of the control logic circuit 210. The second switch SW2 is connected between the complementary holding bit-line HBLB and the first complementary sensing bit-line SBLB1 and is turned on or off in response to the control of the control logic circuit 210. The third switch SW3 is connected between the holding bit-line HBL and the first complementary sensing bit-line SBLB1 and is turned on or off in response to the control of the control logic circuit 210. The fourth switch SW4 is connected between the complementary holding bit-line HBLB and the first sensing bit-line SBL1 and is turned on or off in response to the control of the control logic circuit 210.

The latch circuit 283 is connected to a third sensing signal LA2 and a fourth sensing signal LAB2 and includes PMOS transistors P21 and P22 and NMOS transistors N21 and N22. A second power supply voltage VINTA2, the ground voltage VSS, and a negative voltage VBB or the pre-charge voltage VBL may be applied to each of the third and fourth sensing signals LA2 and LAB2 in accordance with control of the control logic circuit 210 for controlling an operation of the sense amplifier 280. The second power supply voltage VINTA2, the ground voltage VSS, and the negative voltage VBB or the pre-charge voltage VBL may be included in a second driving voltage set. The latch circuit 283 may receive the first bit sensed by the sense amplifying circuit 281 and may store the received first bit.

One end of the PMOS transistor P21 is connected to a line of the third sensing signal LA2, the other end of the PMOS transistor P21 is connected to a second sensing bit-line SBL2, and a gate of the PMOS transistor P21 is connected to the second complementary sensing bit-line SBLB2. One end of the PMOS transistor P22 is connected to the line of the third sensing signal LA2, the other end of the PMOS transistor P22 is connected to the second complementary sensing bit-line SBLB2, and a gate of the PMOS transistor P22 is connected to the second sensing bit-line SBL2. One end of the NMOS transistor N21 is connected to a line of the fourth sensing signal LAB2, the other end of the third NMOS transistor N21 is connected to the second sensing bit-line SBL2, and a gate of the third NMOS transistor N21 is connected to the second complementary sensing bit-line SBLB2. One end of the NMOS transistor N22 is connected to the line of the fourth sensing signal LAB2, the other end of the NMOS transistor N22 is connected to the second complementary sensing bit-line SBLB2, and a gate of the NMOS transistor N22 is connected to the second sensing bit-line SBL2.

The fifth switch SW5 is connected between the first sensing bit-line SBL1 of the sense amplifying circuit 281 and the second sensing bit-line SBL2 of the latch circuit 283 and is turned on or off in response to the control of the control logic circuit 210. The sixth switch SW6 is connected between the first complementary sensing bit-line SBLB1 of the sense amplifying circuit 281 and the second complementary sensing bit-line SBLB2 of the latch circuit 283 and is turned on or off in response to the control of the control logic circuit 210.

FIG. 6 illustrates an example of the first bank array in the semiconductor memory device of FIG. 2 according to example embodiments.

Referring to FIG. 6, in the first bank array 310, I sub-array blocks SCB may be disposed in the second direction D2, and J sub-array blocks SCB may be disposed in the first direction D1 substantially perpendicular to the second direction D2. I and J represent a number of the sub-array blocks SCB in the second direction and the first direction, respectively, and are natural numbers greater than two. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the second direction D2. Sub word-line drivers may be disposed in the sub word-line driver regions SWB. J+1 bit-line sense amplifier regions BLSAB may be disposed, for example between the sub-array blocks SCB in the first direction D1. Bit-line sense amplifiers to sense data stored in the memory cells may be disposed in the bit-line sense amplifier regions BLSAB.

A plurality of conjunction regions CONJ may be adjacent the sub word-line driver regions SWB and the bit-line sense amplifier regions BLSAB. A voltage generator is disposed in each of the conjunction regions CONJ. A portion 390 in the first bank array 310 may be described with reference to FIG. 7 below.

Figure 7:
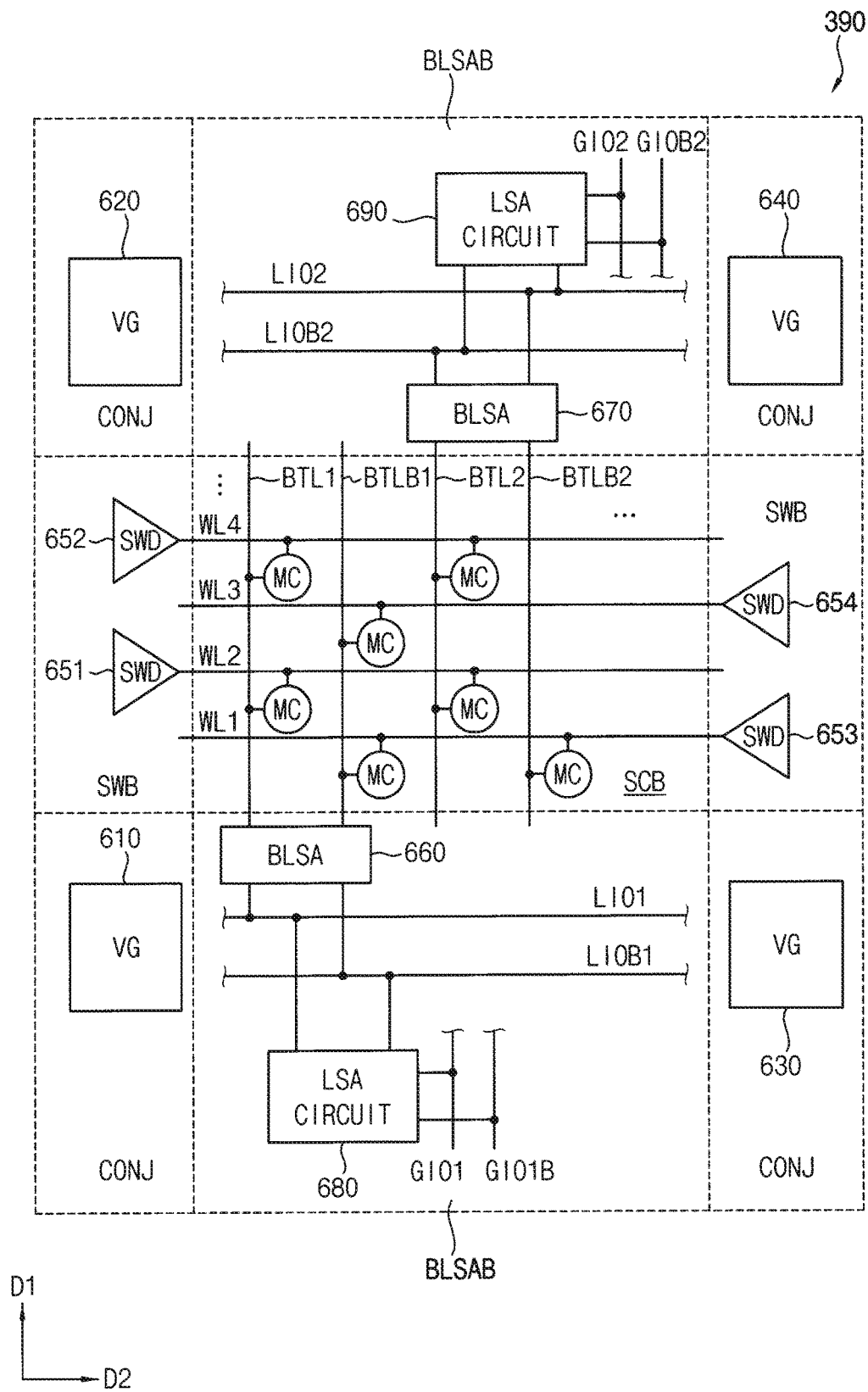
FIG. 7 illustrates a portion of the first bank array in FIG. 7 according to example embodiments.

FIG. 7 illustrates a portion of the first bank array in FIG. 7 according to example embodiments.

Referring to FIGS. 6 and 7, in the portion 390 of the first bank array 310, the sub-array block SCB, the bit-line sense amplifier regions BLSAB, the sub word-line driver regions SWB and the conjunction regions CONJ are disposed.

The sub-array block SCB includes a plurality of word-lines WL1~WL4 extending in a row direction (the second direction D2) and a plurality of bit-line pairs BTL1~BTL2 and BTLB1~BTLB2 extending in a column direction (the first direction D1). The sub-array block SCB includes a plurality of memory cells MCs disposed at intersections between the word-lines WL1~WL4 and the bit-line pairs BTL1~BTL2 and BTLB1~BTLB2.

With reference to FIG. 7, the sub word-line driver regions SWB include a plurality of sub word-line drivers 651, 652, 653 and 654 that respectively drive the word-lines WL1~WL4. The sub word-line drivers 651 and 652 may be disposed in the sub word-line driver region SWB, which is leftward (in this example), with respect to the sub-array block SCB. In addition, the sub word-line drivers 653 and 654 may be disposed in the sub word-line driver region SWB, which is rightward (in this example), with respect to the sub-array block SCB.

The bit-line sense amplifier regions BLSAB include bit-line sense amplifiers BLSA 660 and 670 coupled to the bit-line pairs BTL1~BTL2 and BTLB1~BTLB2, and local sense amplifier circuits 680 and 690. The bit-line sense amplifier 660 may sense and amplify a voltage difference between the bit-line pair BL and BLB to provide the amplified voltage difference to a local I/O line pair LIO1 and LIOB1.

The local sense amplifier circuit 680 controls connection between the local I/O line pair LIO1 and LIOB1 and a global I/O line pair GIO1 and GIOB1, and the local sense amplifier circuit 690 controls connection between the local I/O line pair LIO2 and LIOB2 and a global I/O line pair GIO2 and GIOB2.

As illustrated in FIG. 7, the bit-line sense amplifiers 660 and 670 may be alternately disposed at an upper portion and a lower portion of the sub-array block SCB. The conjunction regions CONJ are disposed adjacent to the bit-line sense amplifier regions BLSAB, the sub word-line driver regions SWB and the sub-array block SCB. A plurality of voltage generators 610, 620, 630 and 640 may be disposed in the conjunction regions CONJ.

Figure 8:
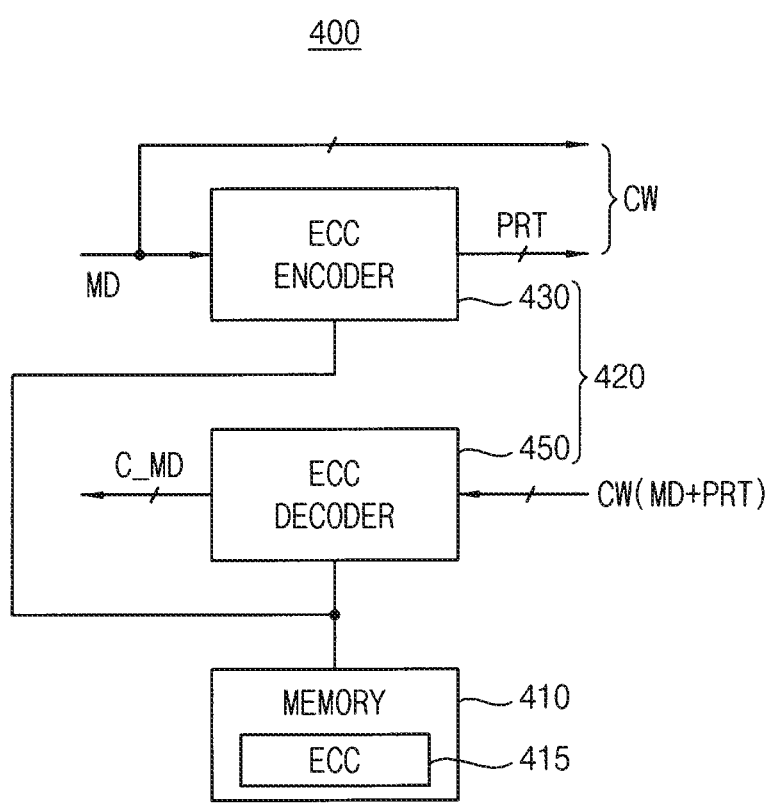
FIG. 8 is a block diagram illustrating an example of the error correction circuit in the semiconductor memory device of FIG. 2 according to example embodiments.

FIG. 8 is a block diagram illustrating an example of the error correction circuit in the semiconductor memory device of FIG. 2 according to example embodiments.

Referring to FIG. 8, the error correction circuit 400 includes an (ECC) memory 410, an ECC encoder 430, and an ECC decoder 450.

The ECC memory 410 stores an ECC 415. The ECC 415 may be represented by a generation matrix (e.g., a data format/structure of the ECC 415 may be a generation matrix), and may include a plurality of column vectors corresponding to data bits in the main data (e.g., MD) and the parity data.

The ECC encoder 430 is connected to the ECC memory 410, and may perform ECC encoding on the main data MD using the ECC 415 stored in the ECC memory 410 to generate the parity data PRT in a write operation of the semiconductor memory device 200. The ECC encoder 430 may provide the I/O gating circuit 290 with the codeword CW including the main data MD and the parity data PRT.

The ECC decoder 450 is connected to the ECC memory 410, may receive the codeword CW including the main data MD and the parity data PRT, may perform ECC decoding on the main data MD based on the parity data PRT using the ECC 415 to correct and/or detect an error bit in the main data MD, and may output corrected main data C_MD. In example embodiments, the ECC decoder 450 may correct t-bit or more errors in the main data using the ECC 415.

Although it is described with reference to FIG. 8 that the ECC memory 410 is coupled to the ECC encoder 430 and the ECC decoder 450, in example embodiments, the ECC memory 410 may be implemented with exclusive OR gates within the ECC encoder 430 and the ECC decoder 450.

Figure 9:
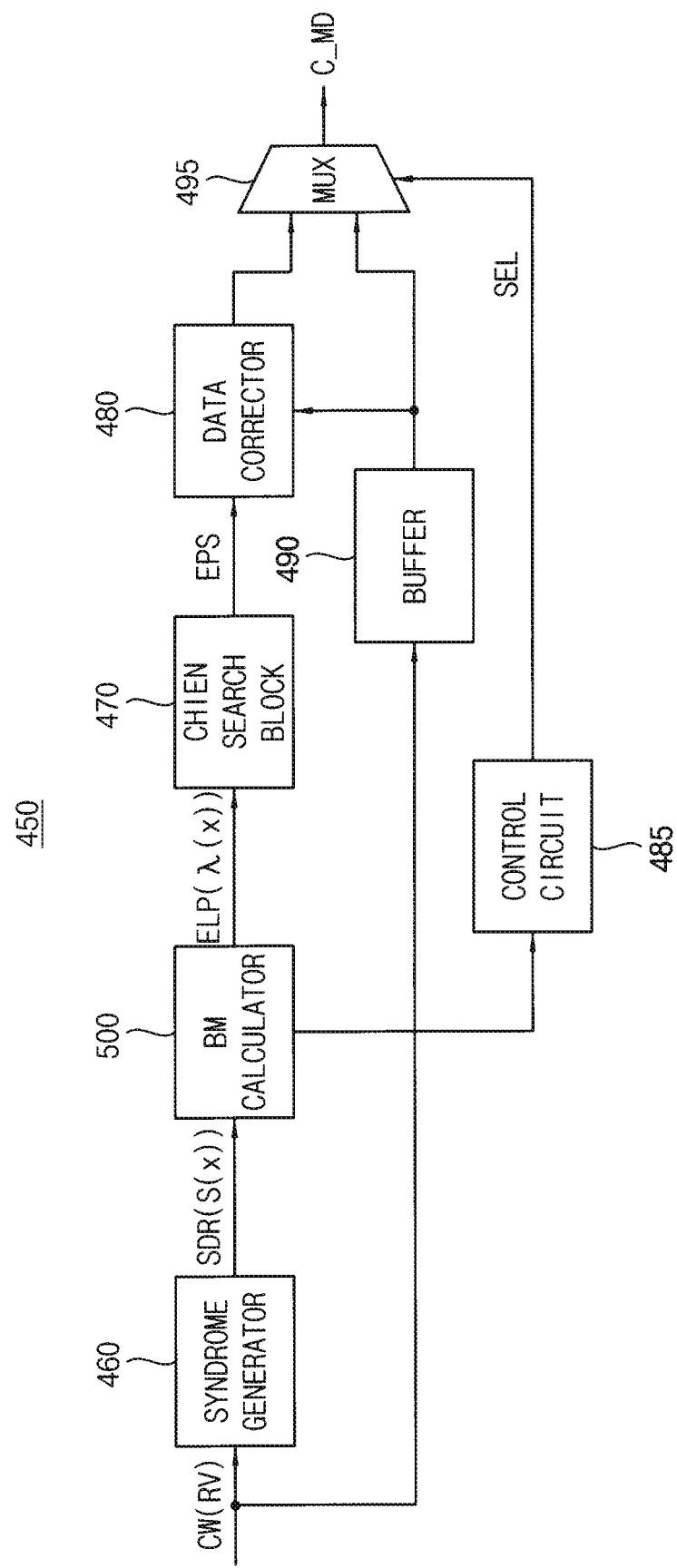
FIG. 9 is a block diagram illustrating the ECC decoder in the error correction circuit of FIG. 8 according to example embodiments.

FIG. 9 is a block diagram illustrating the ECC decoder in the error correction circuit of FIG. 8 according to example embodiments.

Referring to FIG. 9, the ECC decoder 450 may include a syndrome generator 460, a Berlekamp-Massey (BM) calculator 500 of BM generator, a chien search block 470, a data corrector 480, a buffer 490, a control circuit 485 and a multiplexor or selection circuit 495.

The ECC decoder 450 may have t-bit error correction capability, may generate a syndrome based on the read codeword CW using a parity check matrix, may perform t iterations during (t−2) cycles to generate an error locator polynomial ELP based on the syndrome SDR, may search error positions in the read codeword CW based on the error locator polynomial ELP, and may correct the errors in the read codeword CW based on the searched error positions.

The syndrome generator 460 may generate the syndrome SDR by performing a matrix-multiplication operation on the read codeword CW and the parity check matrix. The BM calculator or generator 500 may generate coefficients of the error locator polynomial ELP during the (t−2) cycles based in the syndrome SDR. The chien search block 470 may search the error positions based on the coefficients of the error locator polynomial ELP to output an error position signal EPS. The data corrector 480 may receive the read codeword CW and correct the errors in the read codeword CW based on the error position signal EPS to output a corrected main data C_MD.

The buffer 490 may receive the codeword CW, may store the codeword CW temporarily and may provide the codeword CW to the data corrector 480 and the selection circuit 495.

Figure 10:
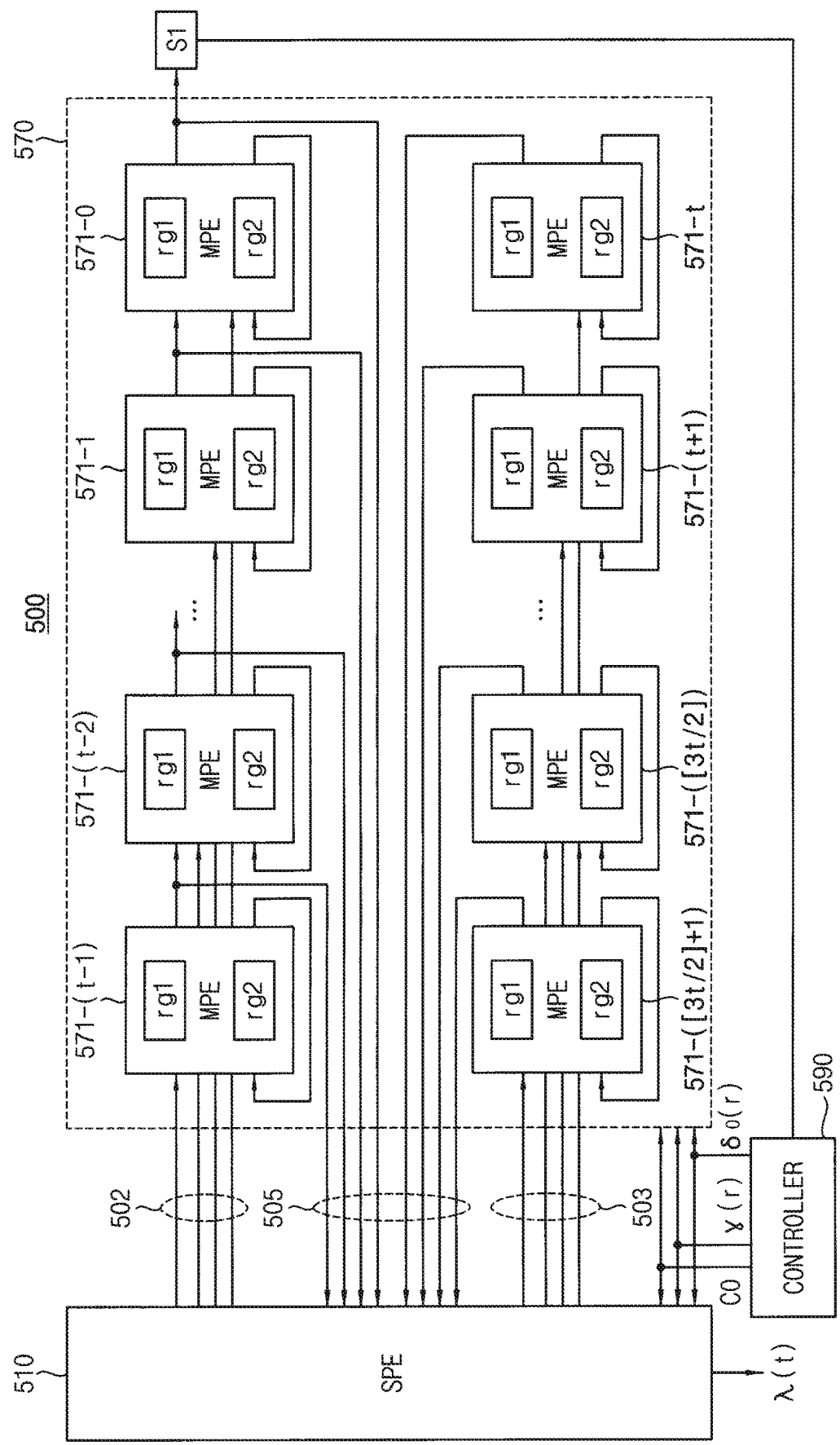
FIG. 10 is a block diagram illustrating the BM calculator or generator in the ECC decoder of FIG. 9 according to example embodiments.

The control circuit 485 may generate a selection signal SEL based on information from the BM calculator or generator 500, shown in FIG. 10, and provide the selection signal SEL to the selection circuit 495. The selection circuit 495 may output one of an output of the data corrector 480 and an output of the buffer 490 as the corrected main data CMD, in response to the selection signal SEL.

When a vector representation of the codeword CW stored in the target page of the memory cell array 300 corresponds to CV, equation 1 is deduced.

$$CV = WDV \times G, \qquad \text{[equation 1]}$$

where WDV is a vector representation of the main data MD and G is a vector representation of the parity generation matrix.

When a vector representation of the codeword CW read from the target page of the memory cell array 300 corresponds to RV, RV may include errors and RV may be represented by equation 2.

$$RV = WDV \times G + E,  \quad \text{[equation 2]}$$

where E corresponds to a vector representation of the errors.

The syndrome generator 460 may perform calculation on the read codeword CW with the parity check matrix. When a vector representation of the parity check matrix corresponds to H, an output of the syndrome generator 460 corresponds to equation 3.

$$RV \times H^T = WDV \times G \times H^T + E \times H^T \quad \text{[equation 3]}$$

The parity generation matrix G and the parity check matrix H are set for satisfying equation 4.

$$G \times H^T = 0 \quad \text{[equation 4]}$$

Therefore, equation 5 is deduced.

$$RV \times H^T = E \times H^T \quad \text{[equation 5]}$$

A result of equation 5 may correspond to a vector representation S(x) of the syndrome SDR.

FIG. 10 is a block diagram illustrating the BM calculator or generator in the ECC decoder of FIG. 9 according to example embodiments.

Referring to FIG. 10, the BM calculator 500 may include a shared processing element (SPE) 510, [3t/2+2] processing elements (MPE) 571-0~571-([3t/2]+1) connected to the shared processing element 510 and a controller 590.

The controller 590 may control the shared processing element 510 and the processing elements 571-1~571-([3t/2]+1) through a first control signal CL0 and intermediate coefficients $\delta_0(r)$ and $\gamma(r)$.

The shared processing element 510 may perform 0-th iteration and a first iteration during 0-th cycle based on a sub syndrome to generate second iteration intermediate coefficients $\delta_i(2)$ and $\theta_i(2)$ (Refer to FIG. 11) associated with a second iteration and may provide the second iteration intermediate coefficients $\delta_i(2)$ and $\theta_i(2)$ to the processing elements 571-1~571-([3t/2]+1).

The processing elements 571-1~571-([3t/2]+1) may perform second through (t−2)-th iterations based on the second iteration intermediate coefficients $\delta_i(2)$ and $\theta_i(2)$ to provide the shared processing element 510 with (t−1)-th iteration intermediate coefficients $\delta_i(t-1)$ and $\theta_i(t-1)$ (Refer to FIG. 11) associated with a (t−1)-th iteration. The shared processing element 510 may perform the (t−1)-th iteration based on the (t−1)-th iteration intermediate coefficients $\delta_i(t-1)$ and $\theta_i(t-1)$ to generate the coefficients $\lambda(t)$ of the error locator polynomial ELP.

In example embodiments, the shared processing element 510 may perform the (t−1)-th iteration by using logics or circuits which are used for generating the second iteration intermediate coefficients.

In FIG. 10, each of the processing elements 571-1~571-([3t/2]+1) may include registers rg1 and rg2 which store initial values, reference numerals 502 and 503 represent signals transferred from the shared processing element 510 to the processing elements 571-1~571-([3t/2]+1) in the 0-th iteration and a reference numeral 505 represent signals transferred from the processing elements 571-1~571-([3t/2]+1) to the shared processing element 510 in the (t−2)-th iteration.

Figure 11:
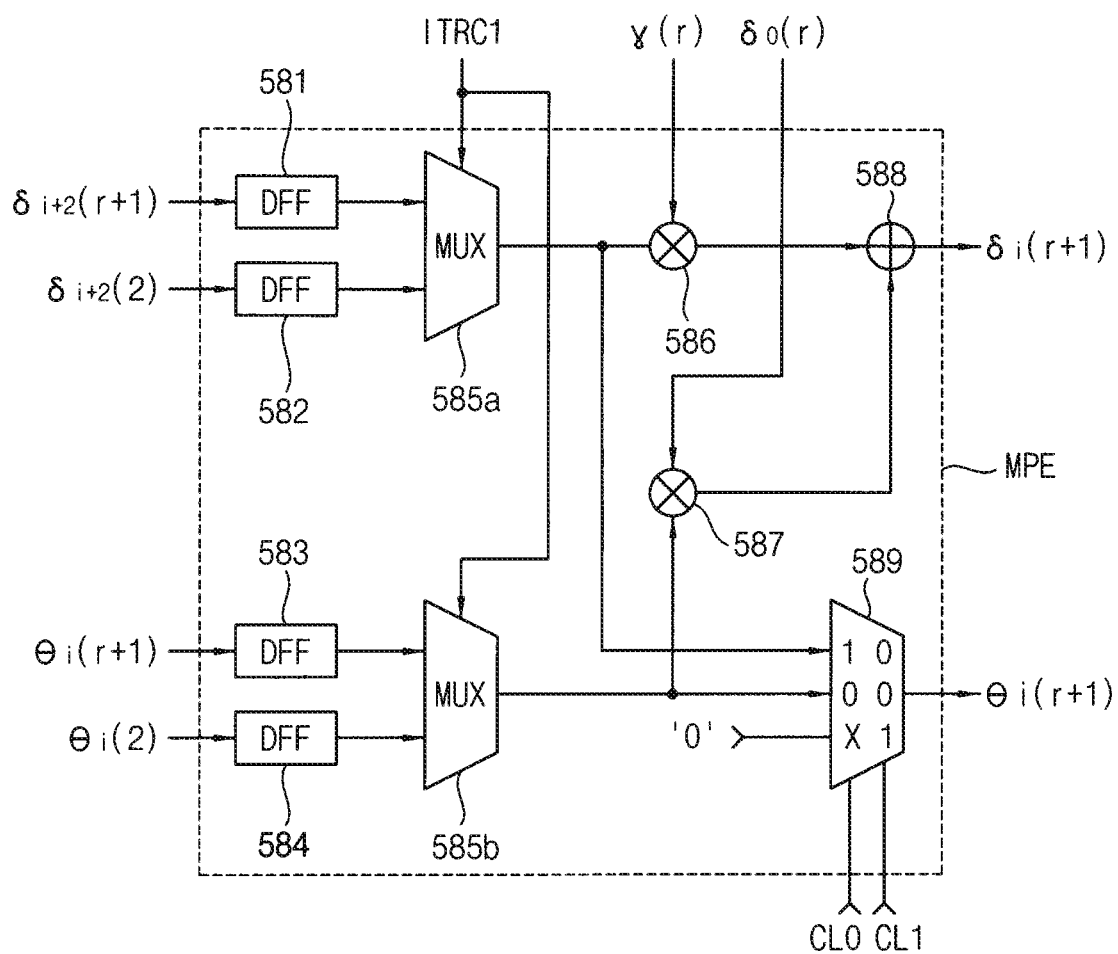
FIG. 11 is a block diagram illustrating one of the processing elements in the BM calculator or generator of FIG. 10 according to example embodiments.

FIG. 11 is a block diagram illustrating one of the processing elements in the BM calculator of FIG. 10 according to example embodiments.

Referring to FIG. 11, a processing element MPE may include a plurality of D flip-flops 581~584, first multiplexers 585a and 585b, Galois field multipliers 586 and 587, an exclusive OR gate 588 and a second multiplexer 589.

The D flip-flops 581~584 may store intermediate coefficients $\delta_{i+2}(r+1)$, $\delta_{i+2}(2)$ $\theta_i(r+1)$ and $\theta_i(2)$, may provide the intermediate coefficients $\delta_{i+2}(r+1)$ and $\delta_{i+2}(2)$ to the multiplexer 585a and may provide the intermediate coefficients $\theta_i(r+1)$ and $\theta_i(2)$ to the multiplexer 585b. The multiplexer 585a selects one of the intermediate coefficients $\delta_{i+2}(r+1)$ and $\delta_{i+2}(2)$ in response to an iteration control signal ITRC1 designating the 0-th iteration and the multiplexer 585b selects one of the intermediate coefficients $\theta_i(r+1)$ and $\theta_i(2)$ in response to an iteration control signal ITRC1.

The Galois field multipliers 586 performs a (Galois field) multiplication on an output of the multiplexer 585a and the intermediate coefficient $\gamma(r)$ and the Galois field multipliers 587 performs a (Galois field) multiplication on an output of the multiplexer 585b and the intermediate coefficient $\delta_0(r)$.

The excusive OR gate 588 performs an exclusive OR operation on outputs of the Galois field multipliers 586 and 587 to provide the intermediate coefficient $\delta_i(r+1)$. The multiplexer 589 may select one of the outputs of the multiplexers 585a and 585b and zero value in response to the first control signal CL0 and the second control signal CL1 to provide the intermediate coefficient $\theta_i(r+1)$.

The intermediate coefficient $\delta_i(r)$ denotes i-th difference coefficient of a difference polynomial which indicates a difference between a present value and a previous value in r-th iteration, the intermediate coefficient $\theta_i(r)$ denotes i-th auxiliary coefficient of an auxiliary polynomial in the r-th iteration, and intermediate coefficient $\gamma(r)$ denotes auxiliary difference value in the r-th iteration.

Therefore, the processing elements 571-1~571-([3t/2]+1) are sequentially connected to with one another, may perform a second iteration in a second cycle based on the second iteration intermediate coefficients $\delta_i(2)$ and $\theta_i(2)$ and may perform a corresponding iteration in each of third through (t−2)-th cycles based on outputs of a previous processing element.

Figure 12:
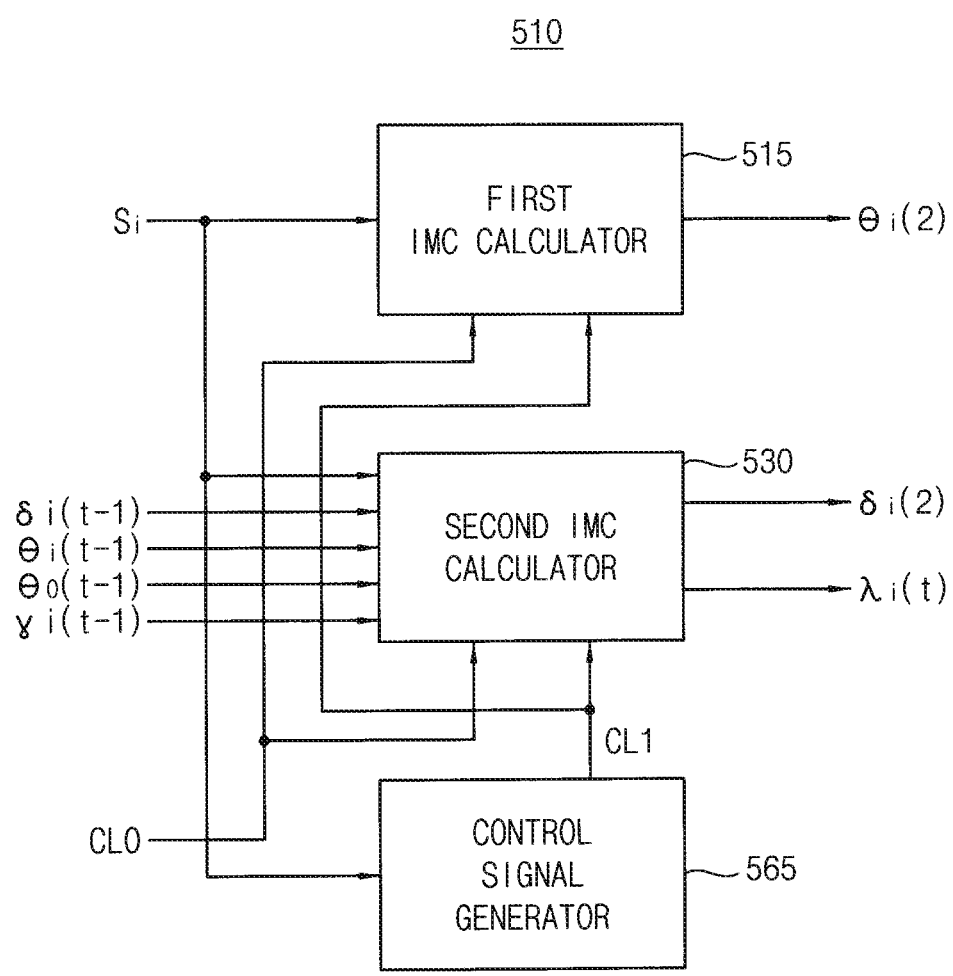
FIG. 12 is a block diagram illustrating the shared processing element in the BM calculator or generator of FIG. 10 according to example embodiments.

FIG. 12 is a block diagram illustrating the shared processing element in the BM calculator or generator of FIG. 10 according to example embodiments.

Referring to FIG. 12, the shared processing element 510 may include a first intermediate coefficient (IMC) calculator 515 or first IMC generator, a second intermediate coefficient (IMC) calculator 530 or second IMC generator, and a control signal generator 565.

The first intermediate coefficient calculator 515 may generate auxiliary coefficients $\theta_i(2)$ of the auxiliary polynomial in the second iteration based on the syndrome $S_i$ and the first control signal CL0. The second intermediate coefficient calculator 530 may generate difference coefficients $\delta_i(2)$ of the difference polynomial and coefficients $\lambda_i(t)$ of the error locator polynomial ELP, based on the (t−1)-th iteration coefficients $\delta_i(t-1)$, $\theta_i(t-1)$, $\theta_0(t-1)$ and $\gamma(t-1)$, the first control signal CL0 and the second control signal CL1.

The control signal generator 565 may generate the second control signal CL1 based on the syndrome $S_i$ and provide the second control signal CL1 to the first intermediate coefficient calculator 515 and the second intermediate coefficient calculator 530.

FIG. 13 illustrates a simplified inversionless BM (SiBM) algorithm which the BM calculator of FIG. 10 executes.

The BM calculator 500 of FIG. 10 executes the SiBM algorithm of FIG. 13 during (t−2) cycles to generate the coefficients $\lambda_i(t)$ of the error locator polynomial ELP.

Figure 14:
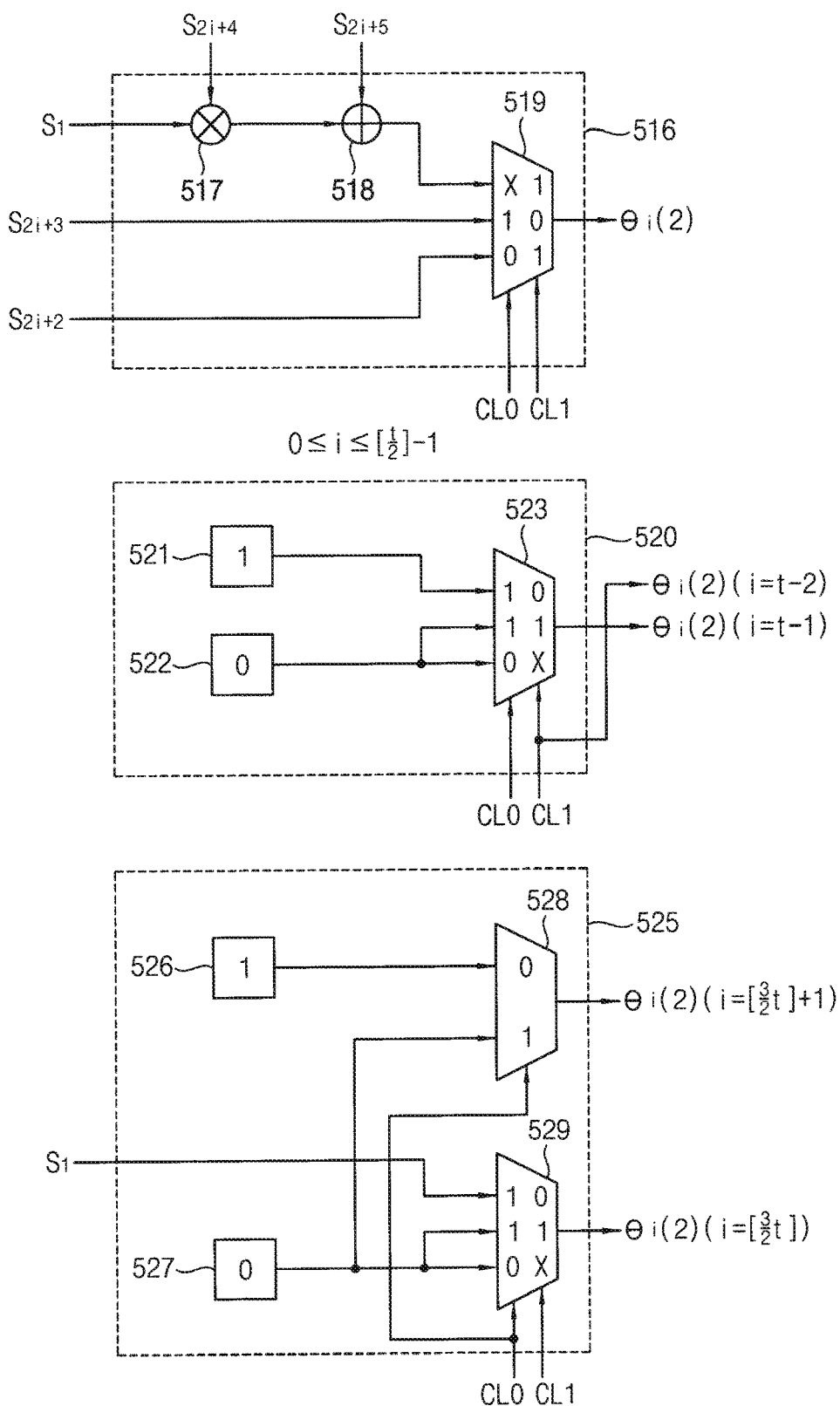
FIG. 14 is a block diagram illustrating the first intermediate coefficient calculator or generator in FIG. 12 according to example embodiments.

FIG. 14 is a block diagram illustrating the first intermediate coefficient calculator 515 in FIG. 12 according to example embodiments.

Referring to FIG. 14, the first intermediate coefficient calculator 515 may include a first sub calculator 516, a second sub calculator 520 and a third sub calculator 525.

The first sub calculator 516 operates in an interval ($0 \leq i \leq [t/2]-1$) and generates i-th auxiliary coefficient $\theta_i(2)$ based on the syndrome, the first control signal CL0 and the second control signal CL1. The first sub calculator 516 includes a Galois field multiplier 517, an exclusive OR gate 518 and a first multiplexer 519. The Galois field multiplier 517 performs Galois field multiplication on sub syndromes $S_1$ and $S_{2i+4}$, the exclusive OR (XOR) gate 518 performs an exclusive OR (XOR) operation on an output of the Galois field multiplier 517 and a sub syndrome $S_{2i+5}$, and the first multiplexer 519 selects one of an output of the XOR gate 518 and sub syndromes $S_{2i+3}$ and $S_{2i+2}$ in response to the first control signal CL0 and the second control signal CL1 to provide the auxiliary coefficient $\theta_i(2)$.

The second sub calculator 520 includes first registers 521 and 522 and a second multiplexer 523. The registers 521 and 522 store '1' and '0' respectively. The second multiplexer 523 outputs one of the '1' and '0' as the auxiliary coefficient $\theta_{t-1}(2)$ and outputs the second control signal as the auxiliary coefficient $\theta_{t-2}(2)$ in response to the first control signal CL0 and the second control signal CL1.

The third sub calculator 525 includes second registers 526 and 527, a third multiplexer 528 and a fourth multiplexer 529. The second registers 526 and 527 store '1' and '0' respectively. The third multiplexer 528 outputs one of '1' and '0' as the auxiliary coefficient $\theta_{[3t/2]+1}(2)$ in response to the second control signal CL1. The fourth multiplexer 529 outputs one of the sub syndrome $S_1$, '0' and '0' as the auxiliary coefficient $\theta_{[3t/2]}(2)$ in response to the first control signal CL0 and the second control signal CL1.

Figure 15A:
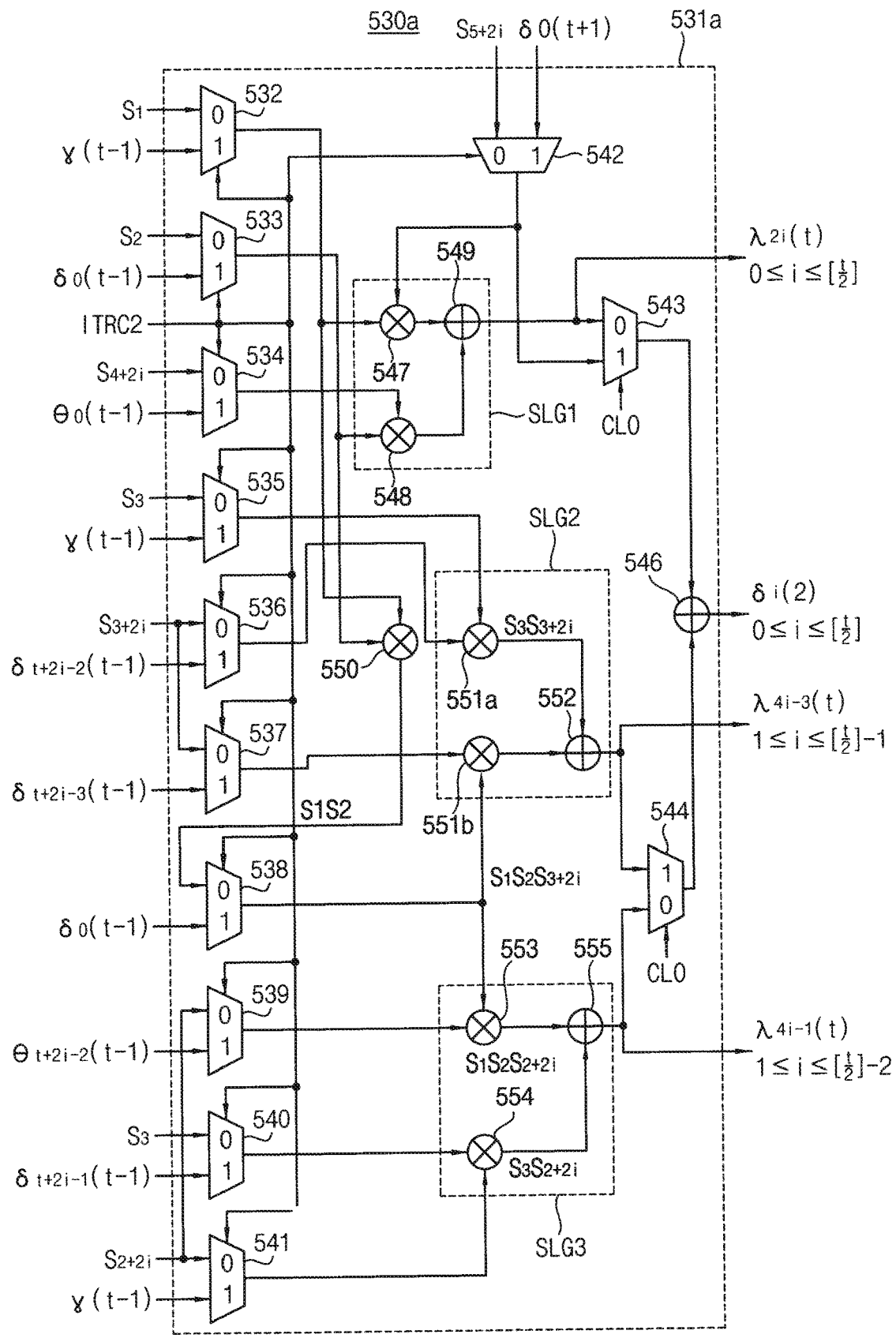

FIGS. 15A and 15B are block diagrams illustrating the second intermediate coefficient calculator in FIG. 12 according to example embodiments.

Referring to FIGS. 15A and 15B, the second intermediate coefficient calculator 530 of FIGS. 12 (530a and 530b) includes a first sub calculator or generator 531a, a second sub calculator or generator 531b and a third sub calculator or generator 531c.

FIG. 15A illustrates the first sub calculator 531a and FIG. 15B illustrates the second sub calculator 531b and the third sub calculator 531c.

Referring to FIG. 15A, the first sub calculator 531a includes multiplexers 532~541, multiplexers 542, 543 and 544, an XOR gate 546, Galois field multipliers 547 and 548, an XOR gate 549, Galois field multiplier 550, Galois field multipliers 551a and 551b, an XOR gate 552, Galois field multipliers 553 and 554 and an XOR gate 555.

The multiplexers 532~541 may select one of input signals as illustrated in response to an iteration control signal ITRC2 designating the (t−2) iteration. The multiplexer 542 selects one of a sub syndrome $S_{5+2i}$ and a difference coefficient $\delta_0(t-1)$ in response to the iteration control signal ITRC2 to output the selected one, and the multiplexer 543 outputs one of an output of the XOR gate 549 and an output of the multiplexer 542 as the coefficients $\lambda_{2i}(t)$ of the error locator polynomial ELP in response to the first control signal CL0 in an interval ($0 \leq i \leq [t/2]$).

The XOR gate 546 performs an XOR operation on outputs of the multiplexers 543 and 544 to provide a difference coefficient $\delta_i(2)$ in the interval ($0 \leq i \leq [t/2]$). The XOR gate 549 performs an XOR operation on outputs of the Galois field multipliers 547 and 548

The Galois field multiplier 550 performs multiplication operation on outputs the multiplexers 532 and 533 to provide an output to the multiplexer 538. The XOR gate 552 performs an XOR operation on outputs of the Galois field multipliers 551a and 551b to provide coefficients $\lambda_{4i-3}(t)$ of the error locator polynomial ELP in an interval ($1 \leq i \leq [t/2]-1$).

The XOR gate 555 performs an XOR operation on outputs of the Galois field multipliers 553 and 554 to provide coefficients $\lambda_{4i-1}(t)$ of the error locator polynomial ELP in an interval ($1 \leq i \leq [t/2]-2$).

In FIG. 15A, the Galois field multipliers 547 and 548 and the XOR gate 549 may constitute a shared logic SLG1, the Galois field multipliers 551a and 551b and the XOR gate 552 may constitute a shared logic SLG2, and the Galois field multipliers 553 and 554 and the XOR gate 555 may constitute a shared logic SLG3. The shared logics or circuits SLG1, SLG2 and SLG3 are commonly used for generating the second iteration coefficients and performing the (t−1)-th iteration.

Referring to FIG. 15B, the second sub calculator 531b includes registers 558 and 559, a Galois field multiplier 556, an XOR gate 557 and multiplexers 560 and 561.

The registers 558 and 559 store '1' and '0' respectively. The Galois field multiplier 556 performs a Galois field multiplication on sub syndromes $S_1$ and $S_2$. The multiplexer 560 selects one of the sub syndrome $S_1$ and '1' in response to the first control single CL0 to provide a difference coefficient $\delta_{t-2}(2)$. The XOR gate 557 performs an XOR operation on an output of the Galois field multiplier 556 and the sub syndrome $S_3$ and the multiplexer 561 selects one of '0' and an output of the XOR gate 557 in response to the first control signal CL0 to provide a difference coefficient $\delta_{t-1}(2)$.

The third sub calculator 531c includes a register 562 and a multiplexer 563. The register 562 stores '0' and the multiplexer 563 selects one of the sub syndrome $S_3$ and '0' in response to the first control signal CL0 to provide a difference coefficient $\delta_{[3t/2]+1}(2)$. In addition, the third sub calculator 531c provides the sub syndrome S2 as a difference coefficient $\delta_{[3t/2]}(2)$.

Figure 16:
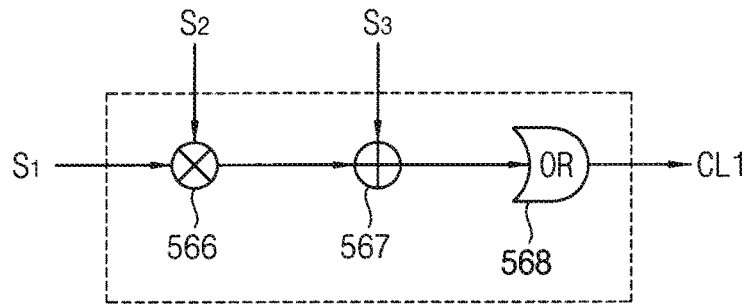
FIG. 16 is a block diagram illustrating an example of the control signal generator in FIG. 12 according to example embodiments.

FIG. 16 is a block diagram illustrating an example of the control signal generator 565 in FIG. 12 according to example embodiments.

Referring to FIG. 16, the control signal generator 565 includes a Galois field multiplier 566, an XOR gate 567 and an OR gate 568.

The Galois field multiplier 566 performs a Galois field multiplication on the sub syndromes $S_1$ and $S_2$, the XOR gate 567 performs XOR operation on an output of the Galois field multiplier 566 and the sub syndrome $S_3$ and the OR gate 568 performs bit-wise OR operation on an output of the XOR gate 567 to provide the second control signal CL1.

Figure 17:
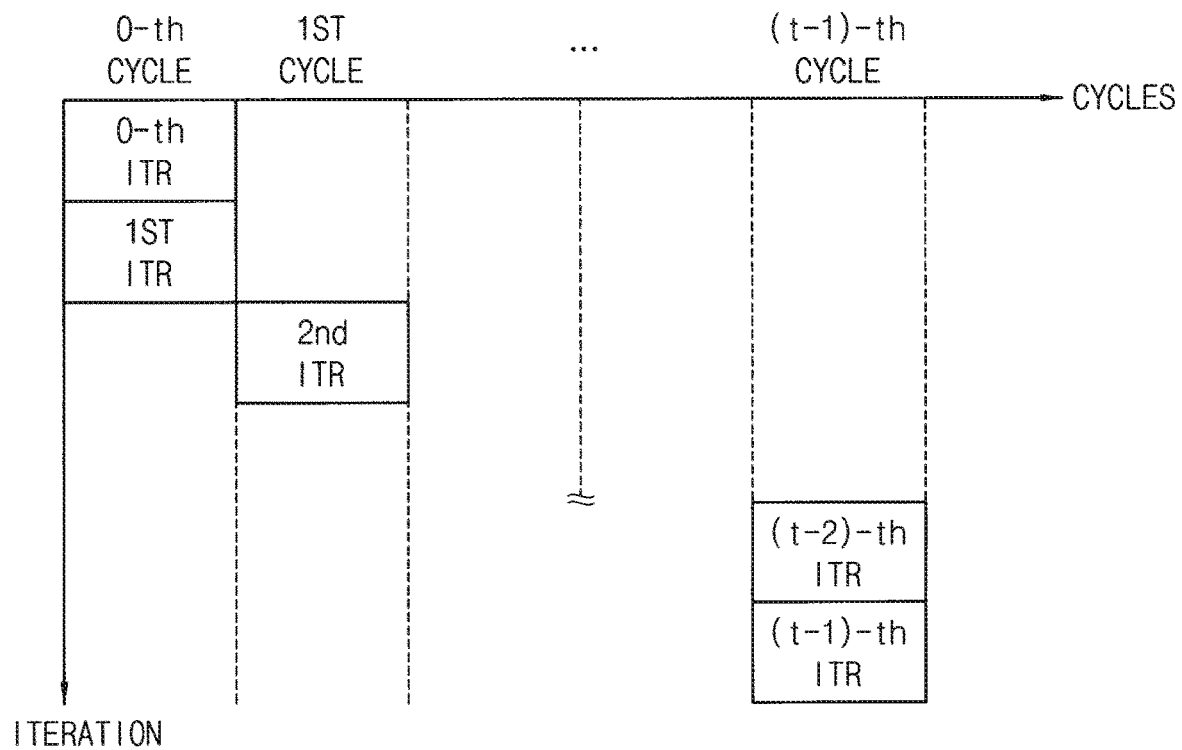
FIG. 17 illustrates an operation of the BM calculator or generator of FIG. 10 according to example embodiments.

FIG. 17 illustrates an operation of the BM calculator of FIG. 10 according to example embodiments.

Referring to FIGS. 10 and 17, the shared processing element 510 performs the 0-th iteration 0-th ITR and a first iteration $1^{st}$ ITR based on the syndrome SDR during a 0-th cycle to generate the second iteration intermediate coefficients associated with the second iteration and provide the second iteration intermediate coefficients to the processing elements 571-1~571-([3t/2]+1). The processing elements 571-1~571-([3t/2]+1) performs second through (t−2)-th iterations 2nd ITR~(t−2)-th ITR based on the second iteration intermediate coefficients to provide the shared processing element 510 with (t−1) iteration coefficients associated with the (t−1) iteration. The shared processing element 510 performs (t−1)-th iteration (t−1)-th ITR based on the (t−1) iteration coefficients to generate coefficients of the error locator polynomial. Therefore, the ECC decoder 450, having t-bit error correction capability, performs t iterations during (t−2) cycles to provide coefficients λ(t) of the error locator polynomial. Accordingly, the ECC decoder 450 may reduce latency of the BM calculator 500.

Figure 18:
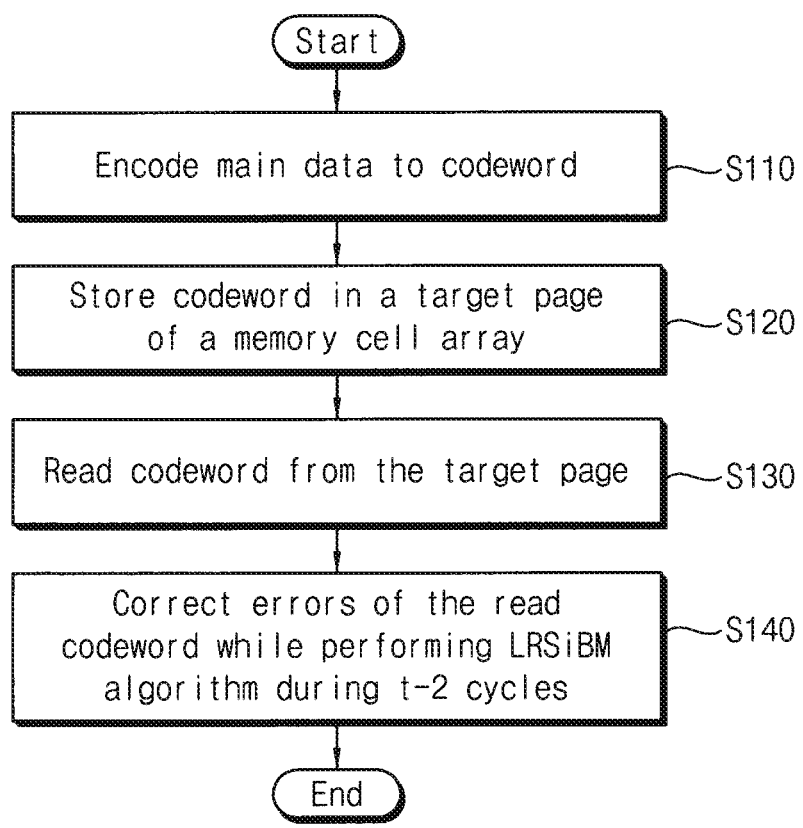
FIG. 18 is a flow chart illustrating a method of operating a semiconductor memory device according to example embodiments.

FIG. 18 is a flow chart illustrating a method of operating a semiconductor memory device according to example embodiments.

Referring to FIGS. 2 through 18, there is provided a method of operating a semiconductor memory device that includes a memory cell array 300 that includes a plurality of memory cells coupled to word-lines and bit-lines, and an error correction circuit 400.

In the method, the error correction circuit 400 performs data (codeword) is read from a target page of the memory cell array 300 (S210). The Error correction circuit 400 generates a parity data PRT by performing an ECC encoding on the main data MD and providing a codeword including the main data MD and the parity data PRT to an I/O gating circuit 290 (operation S110).

The I/O gating circuit 290 stores the codeword CW in a target page of the memory cell array 300 (operation S120). The I/O gating circuit 290 reads the codeword CW from the target page of the memory cell array 300 and provides the read codeword CW to the error correction circuit 400 (operation S130).

An ECC decoder 450 in the error correction circuit 400 corrects errors in the read codeword CW based on the parity data PRT (operation S140). The ECC decoder 450 performs t iterations during (t−2) cycles to generate an error locator polynomial based on the syndrome SDR, searches error positions in the read codeword CW based on the error locator polynomial and corrects the errors in the read codeword CW based on the searched error positions.

Figure 19:
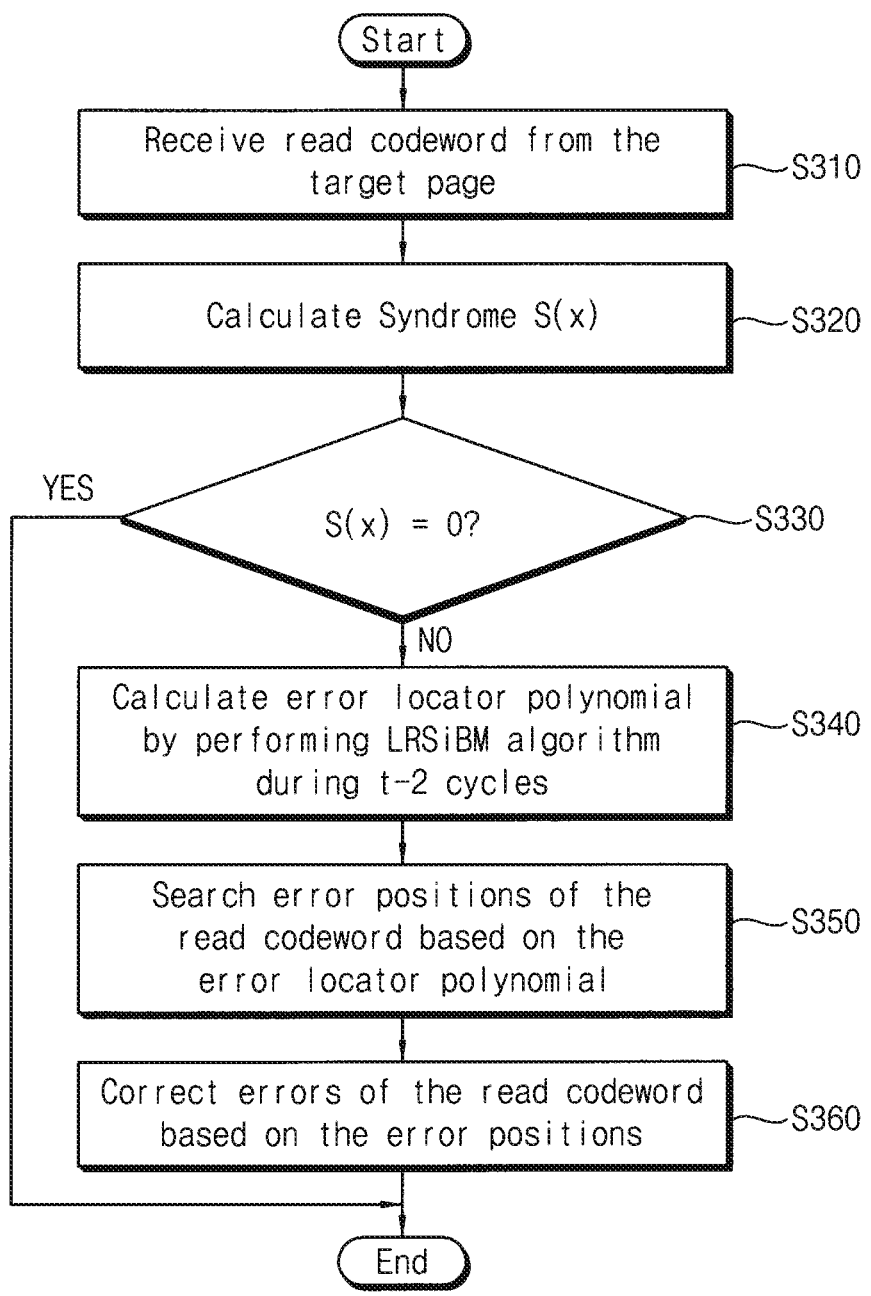
FIG. 19 is a flow chart illustrating a method of ECC decoding in a semiconductor memory device according to example embodiments.

FIG. 19 is a flow chart illustrating a method of ECC decoding in a semiconductor memory device according to example embodiments.

Referring to FIGS. 2 through 17 and 19, there is provided a method of ECC decoding in a semiconductor memory device. According to the method, an ECC decoder 450 in an error correction circuit 400 receives a codeword CW including a main data and a parity data, read from a target page of a memory cell array 300 (operation S310).

A syndrome generator 460 in the ECC decoder 450 generates a syndrome S(x) based on the codeword CW by using a parity check matrix (operation S320). A BM calculator 500 determines whether the syndrome S(x) has a zero value (operation S330). When the syndrome S(x) has a zero value (YES in operation S330), the ECC decoder 450 outputs the main data in the codeword CW.

When the syndrome S(x) does not have a zero value (NO in operation S330), which indicates that the codeword CW includes errors, a BM calculator 500 performs t iterations during (t−2) cycles to execute SiBM algorithm to generate an error locator polynomial ELP based on the syndrome S(x) (operation S340).

A chien search block searches error positions based on the coefficients of the error locator polynomial ELP to output an error position signal EPS to a data corrector (operation S350). The data corrector 480 corrects the errors in the codeword CW based on the error position signal EPS to output a corrected main data C_MD (operation S360).

Figure 20:
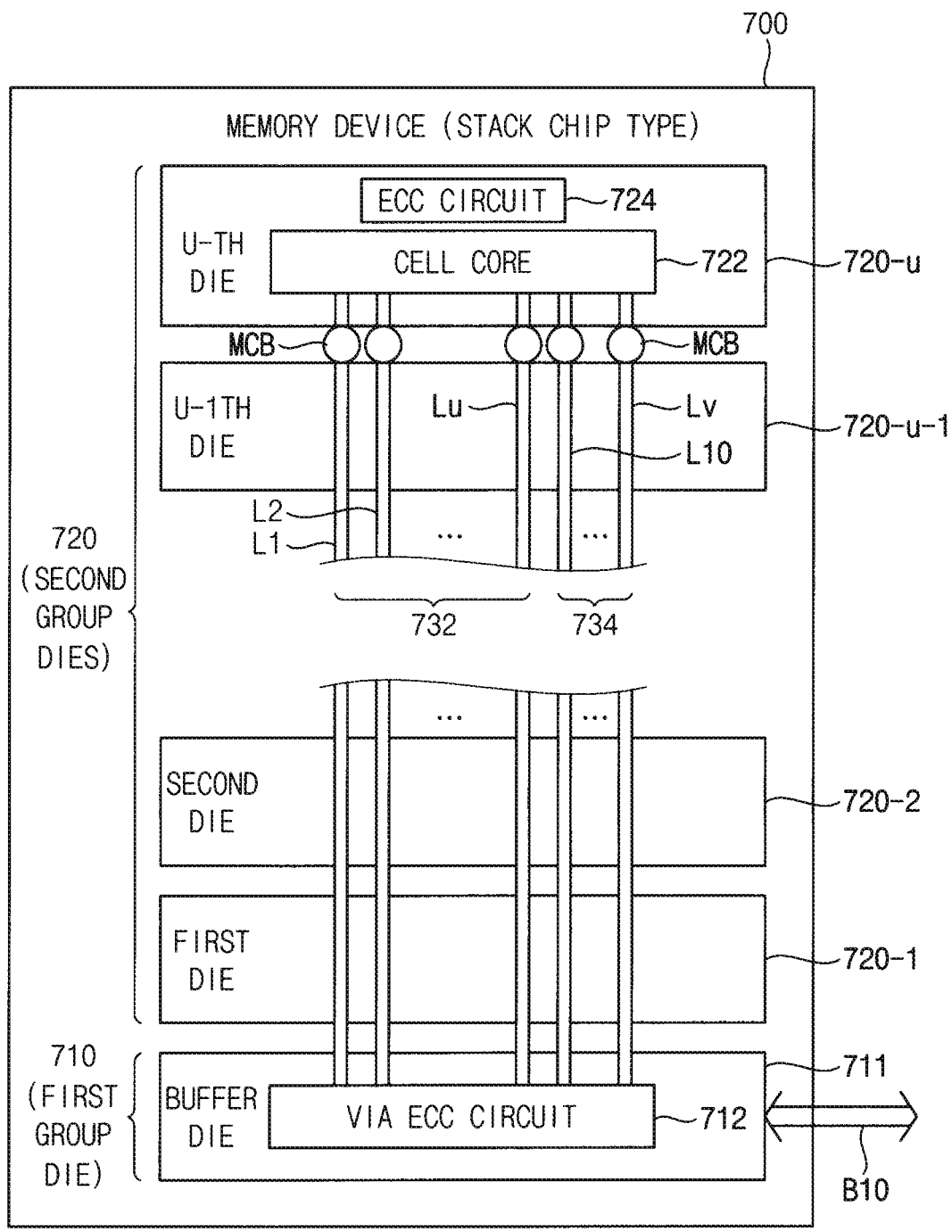
FIG. 20 is a block diagram illustrating a semiconductor memory device according to example embodiments.

FIG. 20 is a block diagram illustrating a semiconductor memory device according to example embodiments.

Referring to FIG. 20, a semiconductor memory device 700 may include a first group die 710 and second group dies 720 providing a soft error analyzing and correcting function in a stacked chip structure. The second group dies 720 may be a high-bandwidth memory (HBM).

The first group die 710 may include at least one buffer die 711. The second group dies 720 may include a plurality of memory dies 720-1 to 720-u (u is a natural number greater than two) which is stacked on the memory die 711 and may convey data through a plurality of through a plurality of silicon via (TSV) lines to the at least one buffer die 711.

Each of the memory dies 720-1 to 720-u may include a cell core 722 and an error correction circuit 724. The cell core 722 may include a plurality of memory cells coupled to word-lines and bit-lines. The error correction circuit 724 may be referred to as an ECC circuit and may employ the error correction circuit 400 of FIG. 8. Therefore, the error correction circuit 724 may perform t iterations during (t−2) cycles to generate an error locator polynomial based on syndrome, may search error positions in the read codeword based on the error locator polynomial, and may correct the errors based on the searched error positions when performing an ECC decoding. Therefore, the error correction circuit 724 may reduce latency.

The buffer die 711 may include an error correction circuit 712 which corrects a transmission error using the transmission parity bits when a transmission error is detected from the transmission data received through the TSV lines and generate error-corrected data. The error correction circuit 712 may be referred to as a via error correction circuit.

The semiconductor memory device 700 may be a stack chip type memory device or a stacked memory device which conveys data and control signals through the TSV lines. The TSV lines may also be called through electrodes.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

A TSV line group 732 which is formed at one memory die 720-u may include TSV lines L1 to Lu, and a parity TSV line group 734 may include TSV lines L10 to Lv.

The TSV lines L1 to Lu of the data TSV line group 732 and the parity TSV lines L10 to Lv of the parity TSV line group 734 may be connected to micro bumps MCB which are correspondingly formed among the memory dies 720-1 to 720-u.

Each of the memory dies 720-1 to 720-u may include DRAM cells each including at least one access transistor and one storage capacitor.

The semiconductor memory device 700 may have a three-dimensional (3D) chip structure or a 2.5D chip structure to communicate with a memory controller through a data bus B10. The buffer die 710 may be connected with the memory controller through the data bus B10.

The error correction circuit 712 may determine whether a transmission error occurs at the transmission data received through the data TSV line group 732, based on the transmission parity bits received through the parity TSV line group 734.

When a transmission error is detected, the error correction circuit 712 may correct the transmission error on the transmission data using the transmission parity bits. When the transmission error is uncorrectable, the error correction circuit 712 may output information indicating occurrence of an uncorrectable data error.

Figure 21:
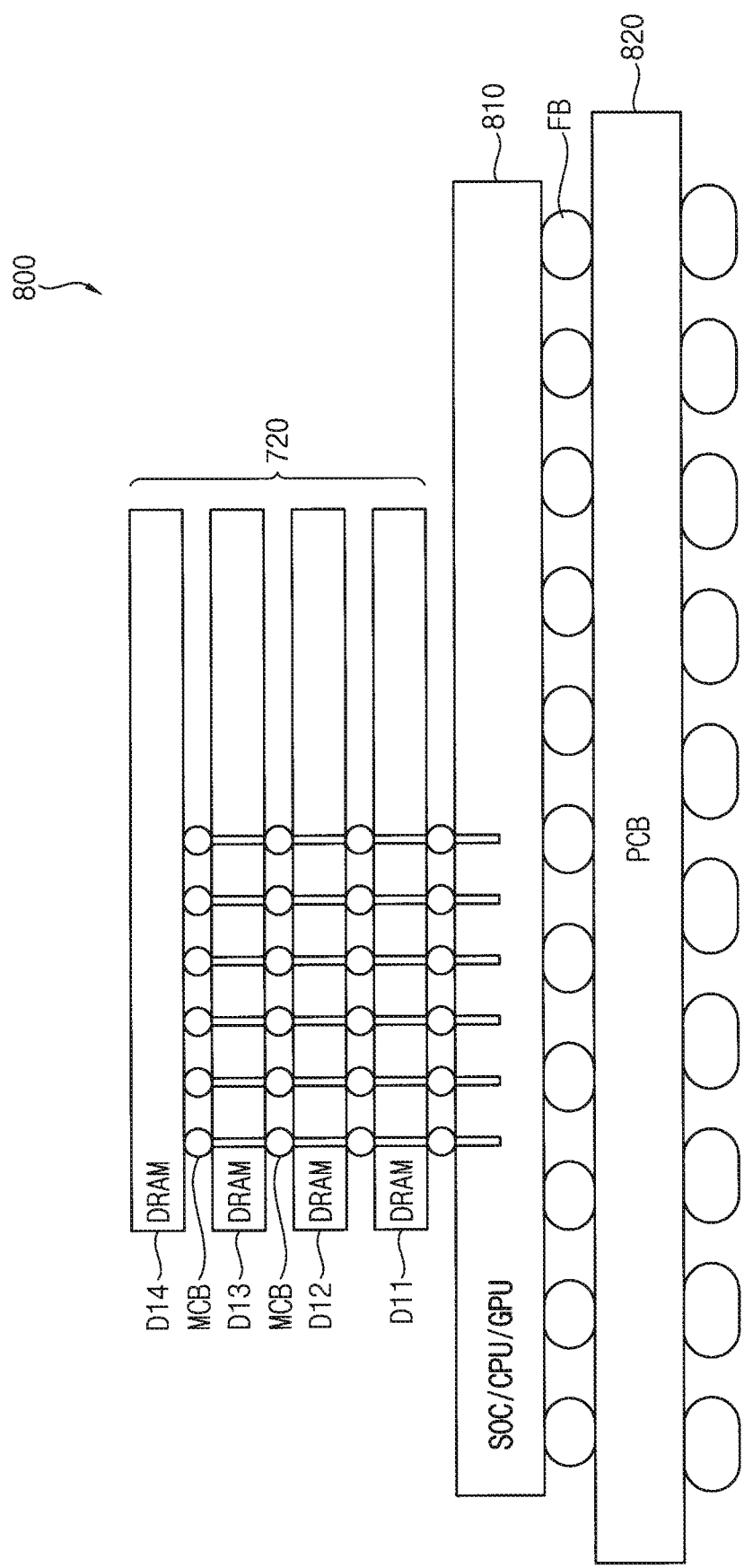
FIG. 21 is a cross-sectional view of a 3D chip structure employing the semiconductor memory device of FIG. 20 according to example embodiments.

FIG. 21 is a cross-sectional view of a 3D chip structure employing the semiconductor memory device of FIG. 20 according to example embodiments.

FIG. 21 shows a 3D chip structure 800 in which a host and a HBM are directly connected without an interposer layer.

Referring to FIG. 21, a host die 810 such as a system-on-chip (SoC), a central processing unit (CPU), or a graphic processing unit (GPU) may be disposed on a printed circuit board (PCB) 820 using flip chip bumps FB. Memory dies D11 to D14 may be stacked on the host die 820 to implement a HBM structure 720 as the memory dies in FIG. 20. In FIG. 14, the buffer die 710 or a logic die of FIG. 20 is omitted. However, the buffer die 710 or the logic die may be disposed between the memory die D11 and the host die 820.

To implement the HBM (620) structure, TSV lines may be formed at the memory dies D11 and D14. The TSV lines may be electrically connected with micro bumps MCB placed between memory dies. In addition, each of the memory dies D11 to D14 may include an error correction circuit such as the error correction circuit 400 of FIG. 8.

Figure 22:
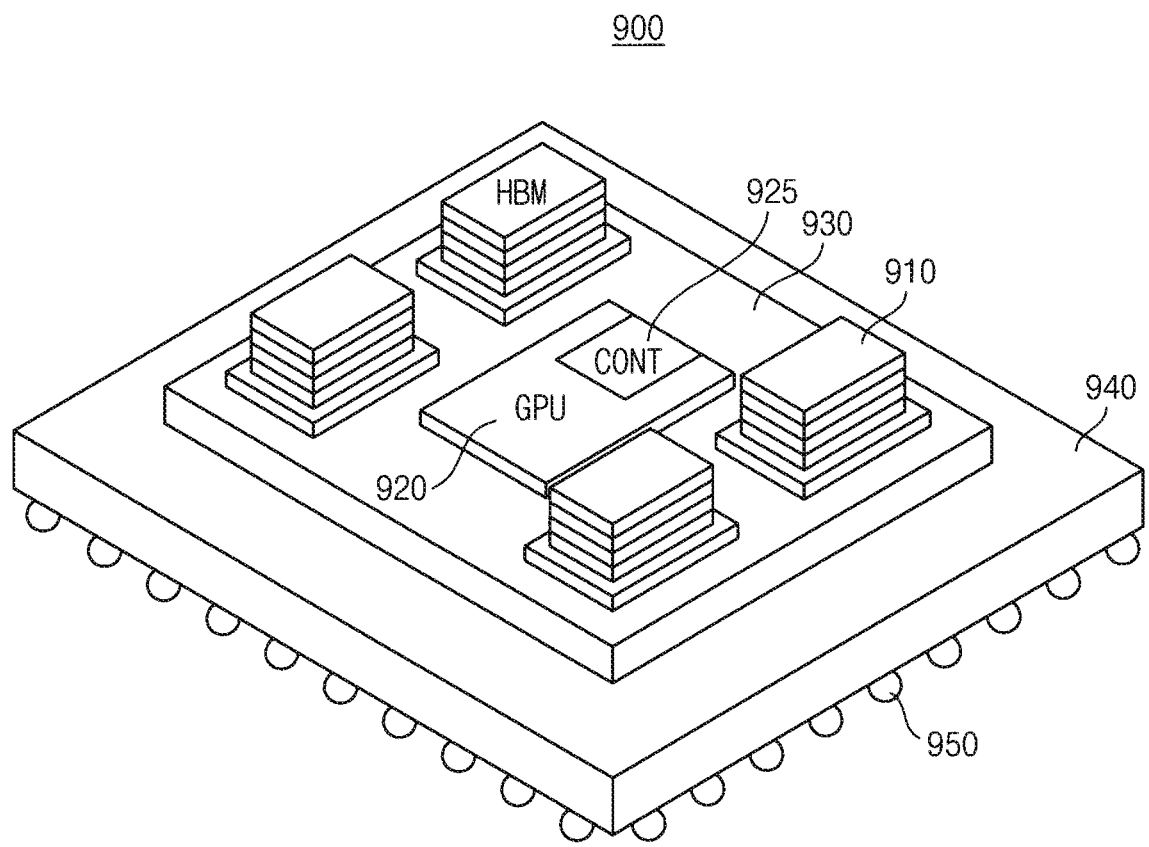
FIG. 22 is a diagram illustrating a semiconductor package including the stacked memory device according to example embodiments.

FIG. 22 is a diagram illustrating a semiconductor package including the stacked memory device according to example embodiments.

Referring to FIG. 22, a semiconductor package 900 may include one or more stacked memory devices 910 and a graphic processing unit (GPU) 920 and the GPU 920 includes a memory controller 925.

The stacked memory devices 910 and the GPU 920 may be mounted on an interposer 930, and the interposer on which the stacked memory devices 910 and the GPU 920 are mounted may be mounted on a package substrate 940. The memory controller 925 may employ the memory controller 100 in FIG. 1.

Each of the stacked memory devices 910 may be implemented in various forms, and may be a memory device in a high bandwidth memory (HBM) form in which a plurality of layers are stacked. Accordingly, each of the stacked memory devices 910 may include a buffer die and a plurality of memory dies, and each of the plurality of memory dies may include a memory cell array and an error correction circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions.

According to example embodiments, an ECC decoder may perform t iterations during (t−2) cycles to generate an error locator polynomial based on syndrome, may search error positions in the read codeword based on the error locator polynomial and may correct the errors based on the searched error positions when performing an ECC decoding. Therefore, the error correction circuit may reduce latency.

Example embodiments of the present disclosure may be applied to systems using semiconductor memory devices that employ DRAM cells and an error correction circuit.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
    a memory cell array comprising a plurality of memory cells coupled to word-lines and bit-lines, the memory cell array further comprising a plurality of sense amplifiers configured to sense data stored in the plurality of memory cells;
    an error correction circuit comprising an error correction code (ECC) decoder configured to perform an ECC decoding on a codeword read from a target page of the memory cell array to correct errors in the codeword that was read, the codeword comprising a main data and a parity data; and
    a control logic circuit configured to control the error correction circuit based on a command and address from an external memory controller,
    wherein the ECC decoder is configured to perform operations comprising:
    performing t-bit error correction, wherein t is an even integer greater than three;
    generating a syndrome based on the codeword using a parity check matrix;
    performing t iterations during (t−2) cycles to generate an error locator polynomial based on the syndrome;
    searching error positions in the codeword based on the error locator polynomial; and
    correcting the errors in the codeword based on the error positions that were searched.

2. The semiconductor memory device of claim 1, wherein the ECC decoder comprises:
    a syndrome generator configured to generate the syndrome by performing a matrix-multiplication operation on the codeword and the parity check matrix;
    a Berlekamp-Massey (BM) generator configured to generate coefficients of the error locator polynomial during the (t−2) cycles based on the syndrome;
    a chien search block configured to search the error positions based on the coefficients of the error locator polynomial to output an error position signal; and
    a data corrector configured to receive the codeword and configured to correct the errors in the codeword based on the error position signal.

3. The semiconductor memory device of claim 2, wherein the BM generator comprises:
    a shared processing element;
    (3t/2+2) processing elements connected to the shared processing element; and
    a controller configured to control the shared processing element and the (3t/2+2) processing elements,
    wherein the shared processing element is configured to perform a 0-th iteration and a first iteration during a 0-th cycle based on the syndrome to generate second iteration intermediate coefficients associated with a second iteration, and is configured to provide the second iteration intermediate coefficients to the (3t/2+2) processing elements,
    wherein the (3t/2+2) processing elements are configured to perform the second iteration through (t−2)-th iterations based on the second iteration intermediate coefficients to provide the shared processing element with (t−1)-th iteration coefficients associated with a (t−1)-th iteration, and wherein the shared processing element is configured to perform the (t−1)-th iteration based on the (t−1)-th iteration coefficients to generate the coefficients of the error locator polynomial.

4. The semiconductor memory device of claim 3, wherein the shared processing element is configured to perform the (t−1)-th iteration by using circuits configured to generate the second iteration intermediate coefficients.

5. The semiconductor memory device of claim 3, wherein the shared processing element comprises:
a first intermediate coefficient generator configured to generate auxiliary coefficients of an auxiliary polynomial among the second iteration intermediate coefficients, based on the syndrome and a first control signal;
a second intermediate coefficient generator configured to generate difference coefficients of a difference polynomial and coefficients of the error locator polynomial among the second iteration intermediate coefficients, based on the (t−1)-th iteration coefficients, the first control signal, and a second control signal; and
a control signal generator configured to generate the second control signal based on the syndrome.

6. The semiconductor memory device of claim 5, wherein the first intermediate coefficient generator comprises:
a first sub generator configured to generate an i-th auxiliary coefficient among the auxiliary coefficients based on the syndrome, the first control signal, and the second control signal, when i is in an interval $0 \leq i \leq (t/2)−1$;
a second sub generator configured to generate the i-th auxiliary coefficient based on the first control signal and the second control signal when $i=t−1$ or $i=t−2$; and
a third sub generator configured to generate the i-th auxiliary coefficient based on a first sub syndrome of the syndrome, the first control signal and the second control signal, when $i=(3t/2)$ or $i=(3t/2)+1$.

7. The semiconductor memory device of claim 6,
wherein the first sub generator comprises a Galois field multiplier, an exclusive OR gate, and a first multiplexer;
wherein the second sub generator comprises first registers and a second multiplexer; and
wherein the third sub generator comprises second registers, a third multiplexer, and a fourth multiplexer.

8. The semiconductor memory device of claim 5, wherein the second intermediate coefficient generator comprises:
a first sub generator configured to generate the difference coefficients and the coefficients of the error locator polynomial based on the syndrome, the difference coefficients, an auxiliary difference value, and an iteration control signal designating the (t−2)-th iteration;
a second sub generator configured to generate a (t−2)-th difference coefficient and a ((t−2)+1)-th difference coefficient of the difference coefficients based on the syndrome and the first control signal; and
a third sub generator configured to generate a (3t/2)-th difference coefficient and a ((3t/2)+1)-th difference coefficient of the difference coefficients based on the syndrome and the first control signal.

9. The semiconductor memory device of claim 8,
wherein the first sub generator comprises a plurality of first multiplexers, a plurality of first Galois field multipliers, and a plurality of first exclusive OR gates;
wherein the second sub generator comprises first registers, a second Galois field multiplier, a second exclusive OR gate, and second multiplexers; and
wherein the third sub generator comprises a second register and a third multiplexer.

10. The semiconductor memory device of claim 9, wherein the first sub generator is configured to generate the second iteration intermediate coefficients and to perform the (t−1)-th iteration by using a one or more of the plurality of first multiplexers, the first Galois field multipliers, and the plurality of first exclusive OR gates.

11. The semiconductor memory device of claim 5, wherein the control signal generator comprises:
a Galois field multiplier configured to perform a Galois field multiplication on a first sub syndrome and a second sub syndrome of the syndrome;
an exclusive OR gate configured to perform an exclusive OR on an output of the Galois field multiplier and a third sub syndrome of the syndrome; and
an OR gate configured to perform an OR operation on an output of the exclusive OR gate to provide the second control signal.

12. The semiconductor memory device of claim 3, wherein the (3t/2+2) processing elements are sequentially connected and are configured to perform the second iteration in a second cycle based on the second iteration intermediate coefficients, and to perform a corresponding iteration in each of third through (t−2)-th cycles based on outputs of a previous processing element among the (3t/2+2) processing elements.

13. The semiconductor memory device of claim 12,
wherein each of the (3t/2+2) processing elements comprises a plurality of D flip-flops, a plurality of first multiplexers configured to select one or more of outputs of the D flip-flops in response to an iteration control signal, Galois field multipliers, an exclusive OR gate, and a second multiplexer,
wherein the iteration control signal is associated with the 0-th iteration.

14. The semiconductor memory device of claim 1, wherein the error correction circuit further comprises:
an ECC encoder configured to perform an ECC encoding on the main data from the external memory controller by using a parity generation matrix to generate the parity data; and
a memory configured to store the parity check matrix and the parity generation matrix.

15. The semiconductor memory device of claim 1,
wherein each the plurality of memory cells stores multi-bit data,
wherein a first sense amplifier of the sense amplifiers is coupled to a bit-line and a complementary bit-line of a first memory cell of the plurality of memory cells,
wherein the first sense amplifier comprises:
a sense amplifying circuit configured to sense a first bit and a second bit of the multi-bit data stored in the first memory cell, wherein the sense amplifying circuit is configured to receive a first driving voltage set and configured to operate based on the first driving voltage set; and
a latch circuit configured to store the first bit provided from the sense amplifying circuit, wherein the latch circuit is configured to receive a second driving voltage set and configured to operate based on the second driving voltage set.

16. The semiconductor memory device of claim 1, wherein each the plurality of memory cells is configured to store a single bit data.

17. The semiconductor memory device of claim 1, comprising:
- at least one buffer die; and
- a plurality of memory dies, the plurality of memory dies being stacked on the at least one buffer die and conveying data through a plurality of through silicon via (TSV) lines,
- wherein at least one of the plurality of memory dies comprises the memory cell array and the error correction circuit.

18. The semiconductor memory device of claim 17, wherein the at least one buffer die comprises a via error correction circuit configured to correct a transmission error included in data transmitted through the TSV lines.

19. A method of operating a semiconductor memory device, wherein the semiconductor memory device comprises a memory cell array that comprises a plurality of memory cells coupled to word-lines and bit-lines, and an error correction circuit, the method comprising:
- reading a codeword comprising a main data and a parity data from a target page of the memory cell array; and
- correcting, by an error correction code (ECC) decoder of the error correction circuit, errors in the codeword by performing an ECC decoding on the codeword,
- wherein the ECC decoder is configured to perform operations comprising:
- performing t-bit error correction, t being an even integer greater than three;
- generating a syndrome based on the codeword using a parity check matrix;
- performing t iterations during (t−2) cycles to generate an error locator polynomial based on the syndrome;
- searching error positions in the codeword based on the error locator polynomial; and
- correcting the errors in the codeword based on the error positions that were searched.

20. A semiconductor memory device comprising:
- a memory cell array comprising a plurality of memory cells coupled to word-lines and bit-lines, and a plurality of sense amplifiers configured to sense data stored in the plurality of memory cells;
- an error correction circuit comprising an error correction code (ECC) decoder configured to perform an ECC decoding on a codeword, read from a target page of the memory cell array to correct errors in the codeword that was read, wherein the codeword comprises a main data and a parity data; and
- a control logic circuit configured to control the error correction circuit based on a command and address from an external memory controller,
- wherein the ECC decoder is configured to perform operations comprising:
- performing t-bit error correction, wherein t is an even integer greater than three;
- generating a syndrome based on the codeword using a parity check matrix;
- performing t iterations during (t−2) cycles to generate an error locator polynomial based on the syndrome;
- searching error positions in the codeword based on the error locator polynomial; and
- correcting the errors in the codeword based on the error positions that were searched,
- wherein the ECC decoder comprises a Berlekamp-Massey generator configured to generate coefficients of the error locator polynomial during the (t−2) cycles based on the syndrome.

* * * * *